US006821867B2

(12) United States Patent
Matsuura et al.

(10) Patent No.: US 6,821,867 B2
(45) Date of Patent: Nov. 23, 2004

(54) METHOD FOR FORMING GROOVES IN THE SCRIBE REGION TO PREVENT A WARP OF A SEMICONDUCTOR SUBSTRATE

(75) Inventors: Nobuyoshi Matsuura, Takasaki (JP); Yasuhiko Kouno, Naka (JP); Hideo Miura, Sendai (JP); Masaharu Kubo, Hachioji (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/421,927

(22) Filed: Apr. 24, 2003

(65) Prior Publication Data

US 2003/0216009 A1 Nov. 20, 2003

(30) Foreign Application Priority Data

May 15, 2002 (JP) ........................................ 2002-140474

(51) Int. Cl.[7] ................................................ H01L 21/78
(52) U.S. Cl. ........................ 438/462; 438/401; 438/460
(58) Field of Search ................................ 438/113, 458, 438/460, 461, 462, 463, 464, 465, 975, 401

(56) References Cited

U.S. PATENT DOCUMENTS

| | | | | |
|---|---|---|---|---|
| 5,024,970 A | * | 6/1991 | Mori | 438/462 |
| 5,213,994 A | * | 5/1993 | Fuchs | 438/421 |
| 5,496,777 A | * | 3/1996 | Moriyama | 438/703 |
| 6,114,215 A | * | 9/2000 | Osugi et al. | 438/401 |
| 6,153,492 A | * | 11/2000 | Wege et al. | 438/401 |
| 6,198,130 B1 | * | 3/2001 | Nobuto et al. | 257/343 |
| 6,614,033 B2 | * | 9/2003 | Suguro et al. | 250/491.1 |

FOREIGN PATENT DOCUMENTS

| | | |
|---|---|---|
| JP | 9-330891 | 6/1996 |
| JP | 10-083976 | 9/1996 |
| JP | 11-186119 | 7/1998 |

\* cited by examiner

*Primary Examiner*—Kevin M. Picardat
(74) *Attorney, Agent, or Firm*—Reed Simth LLP; Stanley P. Fisher, Esq.; Juan Carlos A. Marquez, Esq.

(57) ABSTRACT

The present invention provides a semiconductor device and a manufacturing method thereof which can realize fine processing while preventing a warp of a semiconductor wafer. In forming a plurality of semiconductor elements on a semiconductor wafer, grooves for attenuating stress are formed in scribe regions defined between semiconductor element forming regions. Here, the grooves are formed in the scribe regions except for alignment pattern forming regions such that the alignment pattern forming regions remain in the scribe regions. On the alignment pattern forming regions of the scribe regions, an alignment pattern or a TEG pattern which is used in a photolithography step is formed.

16 Claims, 30 Drawing Sheets

9: SEMICONDUCTOR DIE FORMING REGION
10: SCRIBING REGION
11: GROOVE
19: SEMICONDUCTOR DIE
23: ALIGNMENT PATTERN FORMING REGION

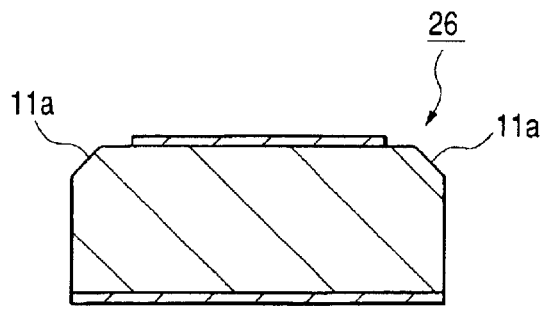
FIG. 33
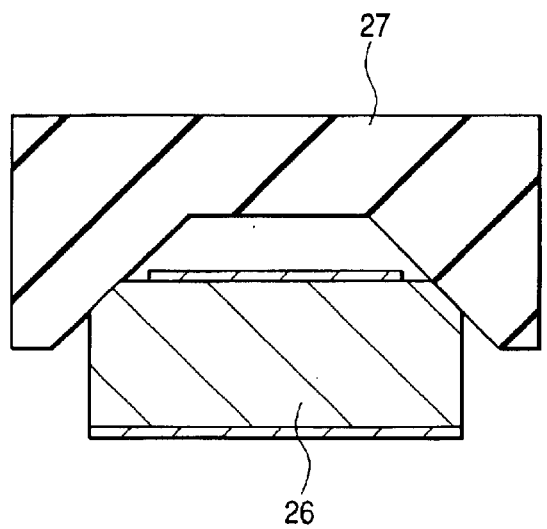
FIG. 34
FIG. 35
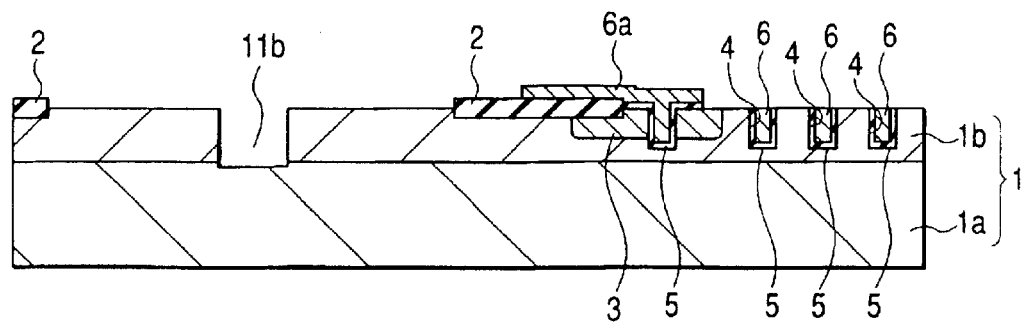

METHOD FOR FORMING GROOVES IN THE SCRIBE REGION TO PREVENT A WARP OF A SEMICONDUCTOR SUBSTRATE

BACKGROUND OF THE INVENTION

The present invention relates to a semiconductor device and a manufacturing technique thereof, and more particularly to a technique which is effectively applicable to a semiconductor device which is manufactured by forming a plurality of respective semiconductor elements on a plurality of semiconductor element forming regions of a semiconductor wafer.

A plurality of respective semiconductor elements are formed on a plurality of semiconductor element forming regions of a semiconductor wafer and, thereafter, the semiconductor wafer is cut in a lattice shape using a dicing saw so as to separate respective semiconductor elements whereby a large number of semiconductor chips are formed from a sheet of semiconductor wafer.

SUMMARY OF THE INVENTION

Recently, to reduce a manufacturing cost of semiconductor chips by increasing the number of semiconductor chips manufactured from one sheet of semiconductor wafer, the semiconductor wafer in use has a diameter thereof large-sized. When the diameter of the semiconductor wafer is increased, the influence of a warp of the semiconductor wafer is increased. When the warp of the semiconductor wafer is increased, there arise various drawbacks. For example, at the time of exposing a photo resist film in a photolithography step, an alignment becomes difficult. Further, there exists a fear that the semiconductor wafer is broken down or cracks occur in the semiconductor wafer at the time of transporting the semiconductor wafer. Further, in a dicing step, the semiconductor wafer is cut in a state that the semiconductor wafer is adhered using a tacky adhesive tape and the semiconductor wafer is separated into respective semiconductor chips by stretching the tape. However, a stress applied to the semiconductor wafer is increased at the time of stretching the tape thus giving rise to chipping. These phenomena reduce a manufacturing yield rate of the semiconductor device and push up a manufacturing cost. Further, the reliability of semiconductor device is reduced. Accordingly, a technique to suppress a warp of the semiconductor wafer is becoming more important.

Japanese Unexamined Patent Publication No. Hei 10(1998)-83976 discloses a technique in which grooves are formed in scribe lines before forming transistors so as to prevent the occurrence of chip cracking and the displacement of dicing at the time of dicing. Further, Japanese Unexamined Patent Publication No. Hei 11(1999)-186119 discloses a technique which forms grooves in scribe lines so as to prevent a warp of a semiconductor wafer.

However, in the above-mentioned publication, an alignment pattern of a photolithography step is not taken into consideration at all. Accordingly, in the techniques disclosed in the above-mentioned publications, it is difficult to perform fine machining or processing. It is difficult to form the alignment pattern on bottom portions of grooves formed in the scribe lines. Even if the alignment pattern could be formed, it is difficult to accurately read the alignment pattern. Further, when the alignment pattern is formed on each semiconductor element forming region of the semiconductor wafer, the number of semiconductor chips which can be manufactured from a sheet of semiconductor wafer is reduced so that a manufacturing cost of the semiconductor devices is increased. Further, in the above-mentioned techniques disclosed in the above-mentioned publications, a step of forming the grooves in the scribe lines becomes necessary as an additional step and hence, the manufacturing steps of the semiconductor device is increased thereby increasing a manufacturing cost.

Accordingly, it is an object of a present invention to provide a semiconductor device and a manufacturing method thereof which can improve drawbacks attributed to a warp of a semiconductor wafer.

It is another object of the present invention to provide a semiconductor device and a manufacturing method thereof which enable fine processing.

It is still another object of the present invention to provide a semiconductor device and a manufacturing method thereof which can reduce a manufacturing cost.

It is still another object of the present invention to provide a semiconductor device and a manufacturing method thereof which can enhance a manufacturing yield rate.

It is still another object of the present invention to provide a semiconductor device and a manufacturing method thereof which can enhance the reliability.

The above-mentioned and other objects and novel features of the present invention will become apparent from the description of this specification and attached drawings.

To briefly explain the summary of typical inventions among inventions disclosed in the present application, they are as follows.

The present invention is characterized in that in scribe regions which are formed between a plurality of semiconductor element forming regions of a semiconductor substrate, the grooves are formed in the scribe regions except for alignment pattern forming regions such that the alignment pattern forming regions remain.

Further, the present invention is characterized in that at the time of forming gate trenches of a semiconductor element having a trench type gate structure by etching, grooves are formed in scribe regions of a semiconductor substrate.

There is provided a semiconductor device comprising:
 a semiconductor substrate;
 a plurality of semiconductor elements which are formed on a plurality of semiconductor element forming regions of the semiconductor substrate; and
 grooves which are formed in the scribe regions such that alignment pattern forming regions remain in the scribe regions defined between the plurality of semiconductor element forming regions of the semiconductor substrate.

In the semiconductor device, in the scribe regions, the alignment pattern forming regions remain like islands inside the grooves.

In the semiconductor device, in the scribe regions, the alignment pattern forming regions remain like bridges inside the grooves.

In the semiconductor device, the grooves are formed in a grid array on a main surface of the semiconductor substrate.

In the semiconductor device, the grooves have a tapered shape.

In the semiconductor device, the plurality of semiconductor elements include semiconductor elements having a trench-type gate structure.

In the semiconductor device, the grooves have a depth greater than a depth of gate-use trenches of the semiconductor elements having the trench-type gate structure.

In the semiconductor device, a width of the grooves is greater than a film thickness of a gate electrode material films of the semiconductor elements having the trench-type gate structure.

In the semiconductor device, a width of the grooves is two or more times of a film thickness of gate electrode material films of the semiconductor elements having the trench-type gate structure.

In the semiconductor device, the semiconductor substrate includes a semiconductor substrate layer and an epitaxial layer formed over the semiconductor substrate layer, and the grooves penetrate the epitaxial layer and reach the semiconductor substrate layer.

In the semiconductor device, the plurality of semiconductor elements include field effect transistors.

In the semiconductor device, the plurality of semiconductor elements include bipolar transistors.

There is provided a semiconductor device comprising:

a semiconductor substrate;

a plurality of semiconductor elements which are formed on a plurality of semiconductor element forming regions of the semiconductor substrate and include vertical MISFETs having a trench-type gate structure; and grooves which are formed in scribe regions defined between the plurality of semiconductor element forming regions of the semiconductor substrate.

In the semiconductor device, the grooves have a depth larger than a depth of gate-use trenches of the vertical MISFETs having the trench-type gate structure.

In the semiconductor device, the semiconductor substrate includes a semiconductor substrate layer and an epitaxial layer formed on the semiconductor substrate layer, and the grooves penetrate the epitaxial layer and reach the semiconductor substrate layer.

In the semiconductor device, a width of the grooves is larger than a width of gate-use trenches of the vertical-type MISFETs having the trench-type gate structure.

In the semiconductor device, the grooves have a tapered shape.

In the semiconductor device, a width of the grooves is two or more times of a film thickness of gate electrode material films of the vertical-type MISFETs having the trench-type gate structure.

BRIEF DESCRIPTION OF THE DRAWINGS

FIG. 33 is an explanatory view of a semiconductor chip manufactured from the semiconductor device shown in FIG. 31.

FIG. 34 is an explanatory view for showing a manner of picking up a semiconductor chip shown in FIG. 33.

FIG. 35 is a cross-sectional view of an essential part in a manufacturing step of a semiconductor device according to another embodiment of the present invention.

DETAILED DESCRIPTION OF THE PREFERRED EMBODIMENTS

Embodiments of the present invention are explained in detail in conjunction with attached drawings hereinafter. Here, in all drawings served for explaining the embodiments, parts having identical functions are given same symbols and their repeated explanation is omitted. Further, in following embodiments, the explanation of equal or similar parts is not basically repeated unless otherwise specified.

Embodiment 1

A semiconductor device and manufacturing steps of the semiconductor device according to this embodiment is explained in conjunction with drawings. In this embodiment, a plurality of semiconductor elements, for example, power MISFETs (Metal Insulator Semiconductor Field Effect Transistors) having a trench type gate structure are respectively formed in a plurality of semiconductor element forming regions of a semiconductor wafer or a semiconductor substrate so as to manufacture the semiconductor device. FIG. 1 to FIG. 5 are cross-sectional views of an essential part in manufacturing steps of the semiconductor device according to this embodiment.

Figure 1:
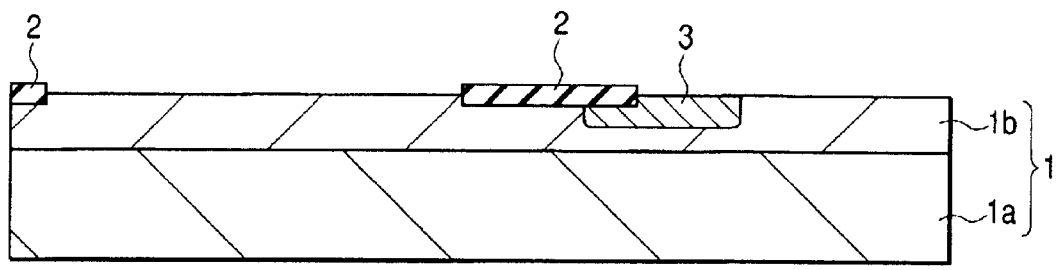
FIG. 1 is a cross-sectional view of an essential part in a manufacturing step of a semiconductor device according to one embodiment of the present invention.

First of all, as shown in FIG. 1, on a main surface of a semiconductor substrate or a semiconductor wafer 1a made of $n^+$ type single crystal silicon doped with arsenic (As), for example, an epitaxial layer 1b made of $n^-$ type single crystal silicon having a thickness of about 10 $\mu$m, for example, is grown by an epitaxial method thus forming a semiconductor substrate or a semiconductor wafer 1 (so called epitaxial wafer). Then, by applying a surface oxidization treatment or the like to the semiconductor wafer 1, a relatively thick insulation film (silicon oxide film in this embodiment) having a thickness of about 600 nm, for example is formed. Thereafter, the insulation film is patterned using a photolithography technique or the like so as to form an insulation film 2 ($SiO_2$ plate). The insulation film 2 can be formed using a LOCOS (Local Oxidization of Silicon) method or the like.

Subsequently, a photo resist film is formed on the main surface of the semiconductor wafer 1 and the photo resist film is patterned using exposure processing. Accordingly, a photo resist pattern which exposes well forming regions and covers regions other than the well forming regions is formed. Using this photo resist pattern as a mask, impurities such as boron (B), for example, or the like is introduced into or injected into the main surface of the semiconductor wafer 1 by ion implantation. Then, the photo resist pattern is removed and thermal diffusion processing or the like is applied to the main surface of the semiconductor wafer 1 so as to form p type wells 3.

Then, a photo resist film is formed on the semiconductor wafer 1 and the photo resist film is patterned using exposure processing. Accordingly, a photo resist pattern which exposes gate trench forming regions and covers regions other than the gate trench forming regions is formed. Then, using the photo resist pattern as an etching mask, portions of the semiconductor wafer 1 exposed from the photo resist pattern are removed by an anisotropic dry etching method. Accordingly, grooves for forming trench gates, that is, gate trenches 4 are formed. Thereafter, silicon isotropic etching such as isotropic dry etching or the like is applied to the semiconductor wafer 1. Accordingly, corners of bottom portions of the gate trench (groove) 4 are removed and smoothed. A depth of the gate trench 4 is greater than a depth of the p type well 3 and is smaller than a depth of bottom portions of the epitaxial layers 1b. For example, the depth of the gate trench 4 is about 2 $\mu$m.

Subsequently, cleaning is performed when necessary and, thereafter, gate oxidization processing such as thermal oxidization processing is applied to the semiconductor wafer 1 so as to form relatively thin gate insulation films (silicon oxide films in this embodiment) 5 on inner wall surfaces (side surfaces and bottom surfaces) of the gate trenches 4 or the like. Here, by further stacking a silicon oxide film using a CVD method after the thermal oxidization processing, the gate insulation film 5 may be constituted of a thermal oxidization film and a CVD stacked film.

Figure 2:
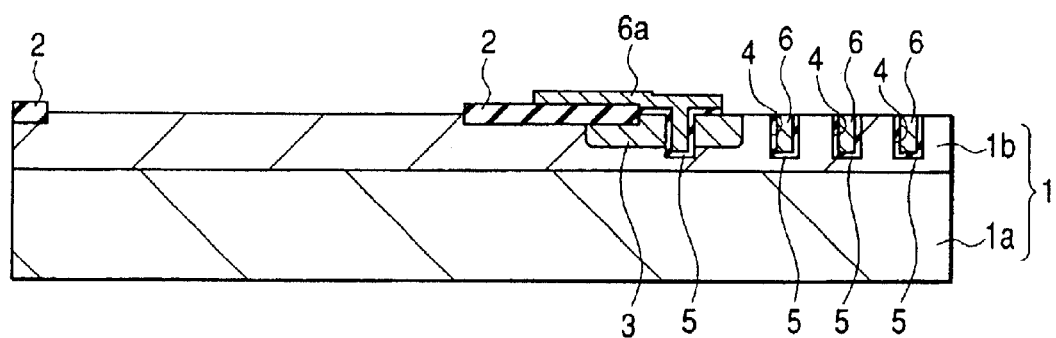
FIG. 2 is a cross-sectional view of an essential part in a manufacturing step of the semiconductor device which follows the manufacturing step shown in FIG. 1.

Then, on the main surface of the semiconductor wafer 1, a conductive film (gate electrode material film) formed of a polysilicon film (doped polysilicon film) of low resistance, for example is formed using a CVD method or the like. Then, a photo resist pattern which covers the gate line forming regions and exposes regions other than the gate line forming regions is formed on the above-mentioned conductive film. Using such a photo resist pattern as an etching mask, the above-mentioned conductive film is etched back. Accordingly, gate portions 6 which are formed of polysilicon having low resistance or the like embedded in the inside of the gate trench 4 and gate line portions 6a which are integrally formed with the gate portion 6 are formed. In this manner, the structure shown in FIG. 2 is obtained.

Then, on the main surface of the semiconductor wafer 1, a photo resist pattern for forming channel is formed. Then, impurities such as boron (B), for example, is injected by ion implantation and, thereafter, the photo resist pattern is removed and thermal diffusion processing is performed when necessary. Accordingly, channel regions 7 are formed.

Figure 3:
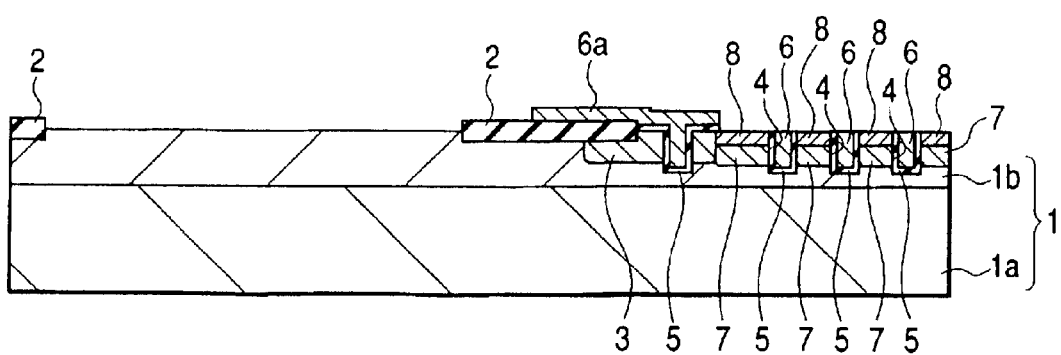
FIG. 3 is a cross-sectional view of an essential part in a manufacturing step of the semiconductor device which follows the manufacturing step shown in FIG. 2.

Subsequently, on the main surface of the semiconductor wafer 1, a photo resist pattern for forming source regions is formed. Then, impurities such as arsenic (As), for example, is injected by ion implantation and, thereafter, the photo resist pattern is removed and thermal diffusion processing is performed when necessary. Accordingly, source regions 8 are formed. The structure shown in FIG. 3 is obtained in this manner.

Figure 4:
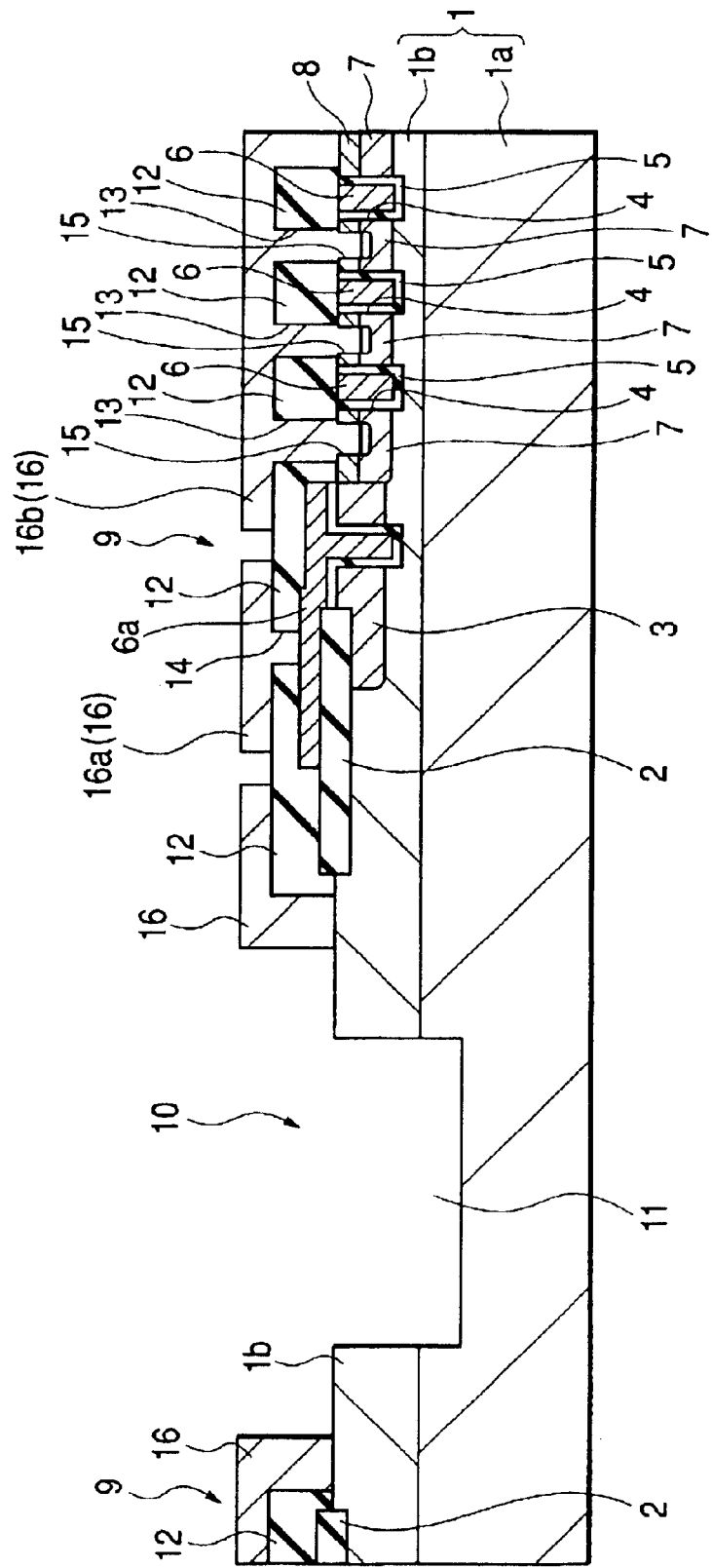
FIG. 4 is a cross-sectional view of an essential part in a manufacturing step of the semiconductor device which follows the manufacturing step shown in FIG. 3.

Subsequently, as shown in FIG. 4, in a scribe region 10 which is formed between respective semiconductor element forming regions 9 on the main surface of the semiconductor wafer 1, a groove 11 is formed. In this embodiment, as explained later, the groove 11 is formed in the scribe region 10 except for alignment pattern forming regions such that the alignment pattern forming regions remain within the scribe region 10. The groove 11 attenuates or disperses stress so as to perform functioning of reducing a warp of the semiconductor wafer 1. The groove 11 may be formed by a photolithography method or an etching method, for example. For example, by anisotropic dry etching which uses an $SF_6$ gas and an $O_2$ gas, a portion of the semiconductor wafer 1 exposed from the photo resist pattern is selectively removed thus forming the groove 11. In this manner, the groove 11 having a given shape is properly formed at a give position. Although the groove 11 may be formed by performing both of anisotropic etching and isotropic etching, when the groove 11 is formed using only the anisotropic dry etching, the number of steps can be reduced. Further, the groove 11 may be formed by wet etching which uses fluorine nitric acid or the like. Further, it is preferable that the groove 11 has a depth which allows the groove 11 to pierce the epitaxial layer 1b and to reach the semiconductor wafer 1a which constitutes a highly concentrated semiconductor substrate layer. By having such a depth, the groove 11 can obtain a sufficient stress attenuation effect.

The step of forming the groove 11 may be performed at an arbitrary stage of the steps. However, it is preferable to perform the step before forming aluminum electrodes (a gate electrode 16a and a source line 16b) described later (that is, before forming an aluminum film 16). Accordingly, with the provision of the grooves 11, it is possible to disperse or attenuate stress attributed to the difference of thermal expansion rate between the semiconductor wafer (silicon wafer) 1 and the surface aluminum electrode within the semiconductor wafer surface. Accordingly, a warp of the semiconductor wafer 1 can be prevented. Further, when a gate electrode material film is formed of a metal material film (when the gate electrode 16a is made of a metal gate electrode), it is preferable to form the groove 11 before forming the gate electrode material film. Accordingly, it is preferable to form the groove 11, before or in the midst of forming the semiconductor element on the semiconductor wafer 1 as well as before forming the metal material film (metal electrode layer) of the semiconductor element.

Then, an insulation film 12 which is formed of a laminated film consisting of a HLD film (a film formed by a high-temperature low-pressure CVD method) and a PSG (Phospho-Silicate Glass) film, for example, is formed on a main surface of the semiconductor wafer 1 and is patterned using a photolithography technique and an etching technique. Here, contact holes 13 which expose a main surface of the semiconductor wafer 1 and a through hole 14 which exposes a portion of the gate line portion 6a are formed in the insulation film 12.

Subsequently, the semiconductor wafer 1 which is exposed through the contact holes 13 is etched thus forming holes 15. Then, into the semiconductor wafer 1 which is exposed through the contact whole 13 and the hole 15, impurities such as boron B), for example, are injected by an ion implantation method thus forming the $p^+$ type semiconductor region.

Subsequently, on the main surface of the semiconductor wafer 1, for example, a titanium-tungsten film not shown in the drawing is formed when necessary and, thereafter, an aluminum film (or an aluminum alloy film) 16 is formed on the titanium-tungsten film by sputtering method or the like. Then, the laminated film formed of the titanium-tungsten film 16 and the aluminum film is patterned using a photolithography technique and an etching technique. Accordingly, surface electrodes such as a gate electrode 16a and a source line 16b are formed.

Figure 5:
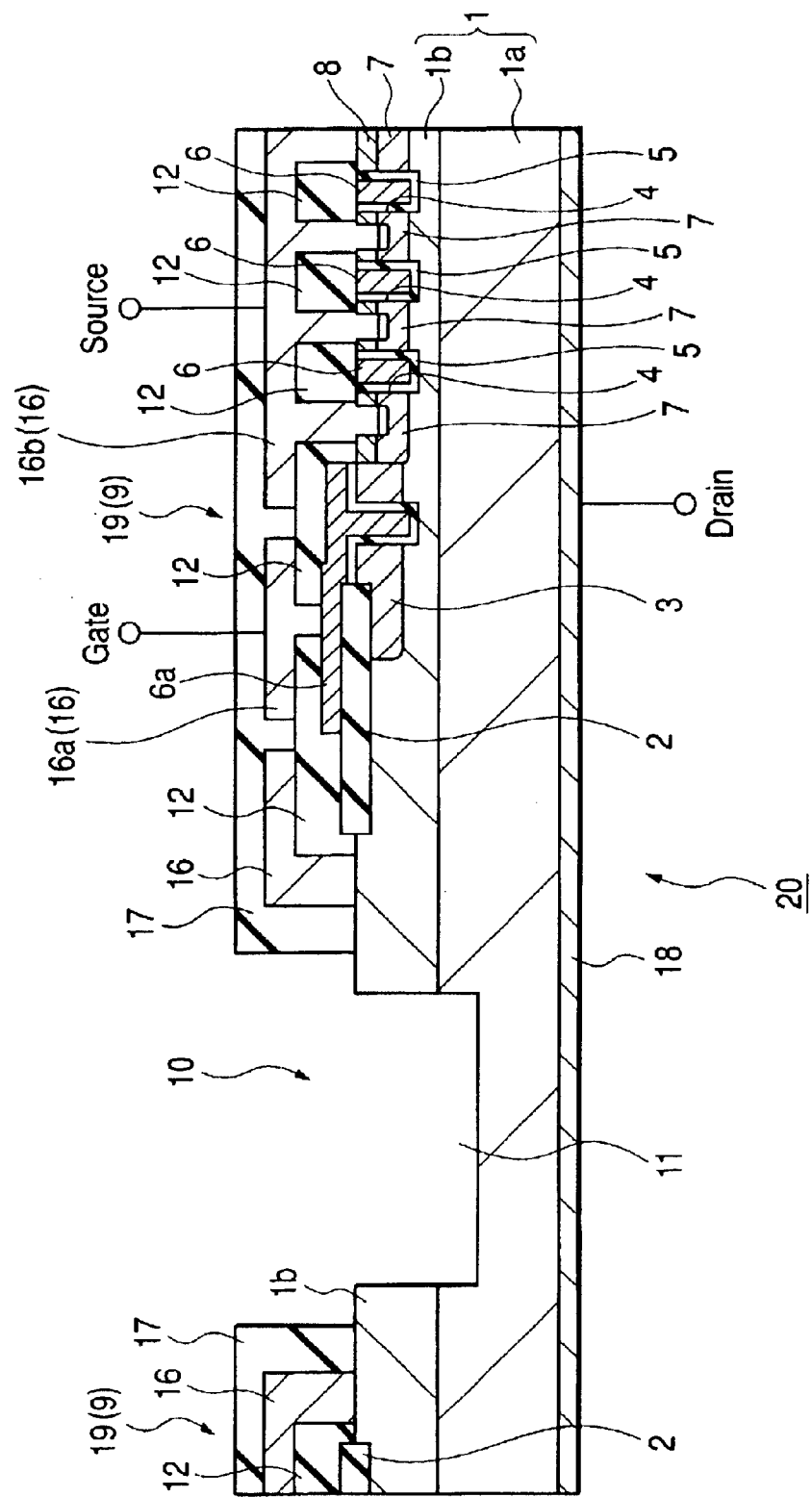
FIG. 5 is a cross-sectional view of an essential part in a manufacturing step of the semiconductor device which follows the manufacturing step shown in FIG. 4.

Subsequently, on the main surface of the semiconductor wafer 1, an insulation film (PIQ film: a product name of Hitachi Chemical Co., Ltd.) 17 for surface protection which is made of polyimide-based resin, for example, is formed. Then, the insulation film 17 is patterned using a photolithography technique and an etching technique so as to form opening portions (not shown in the drawing) through which portions of the gate electrode 16a and the source line 16b are exposed whereby bonding pads are formed. Then, a back surface of the semiconductor wafer 1 is ground or polished so as to make the semiconductor wafer 1 thin. Thereafter, for example, nickel, titanium, nickel and gold are applied to the back surface of the semiconductor wafer 1 by a vapor deposition method or the like thus forming a drain electrode 18. Accordingly, the structure shown in FIG. 5 is obtained. That is, a plurality of semiconductor elements 19 such as vertical type power MISFET having the trench type gate structure are formed on the semiconductor wafer 1 so that the semiconductor device 20 of the present embodiment is manufactured. Here, the vertical type MISFET corresponds to a MISFET in which an electric current between source and drain flows in the thickness direction of the semiconductor wafer (direction substantially perpendicular to the main surface of the semiconductor wafer).

The semiconductor device 20 of this embodiment manufactured in this manner is cut or diced using a dicing saw. Accordingly, the semiconductor device 20 is separated into a plurality of semiconductor chips (MISFET chips) or semiconductor elements. Here, in the dicing step, the semiconductor wafer may be cut or ground by any method including a full-cut method, a semi-full-cut method or a half-cut method. Although the semiconductor wafer 1 on which a plurality of semiconductor elements 19 are formed is referred to as the semiconductor device 20 in this embodiment, it is possible to call each divided piece obtained by dicing such a semiconductor device (semiconductor wafer) 20, that is, the semiconductor chip as the semiconductor device.

Figure 6:
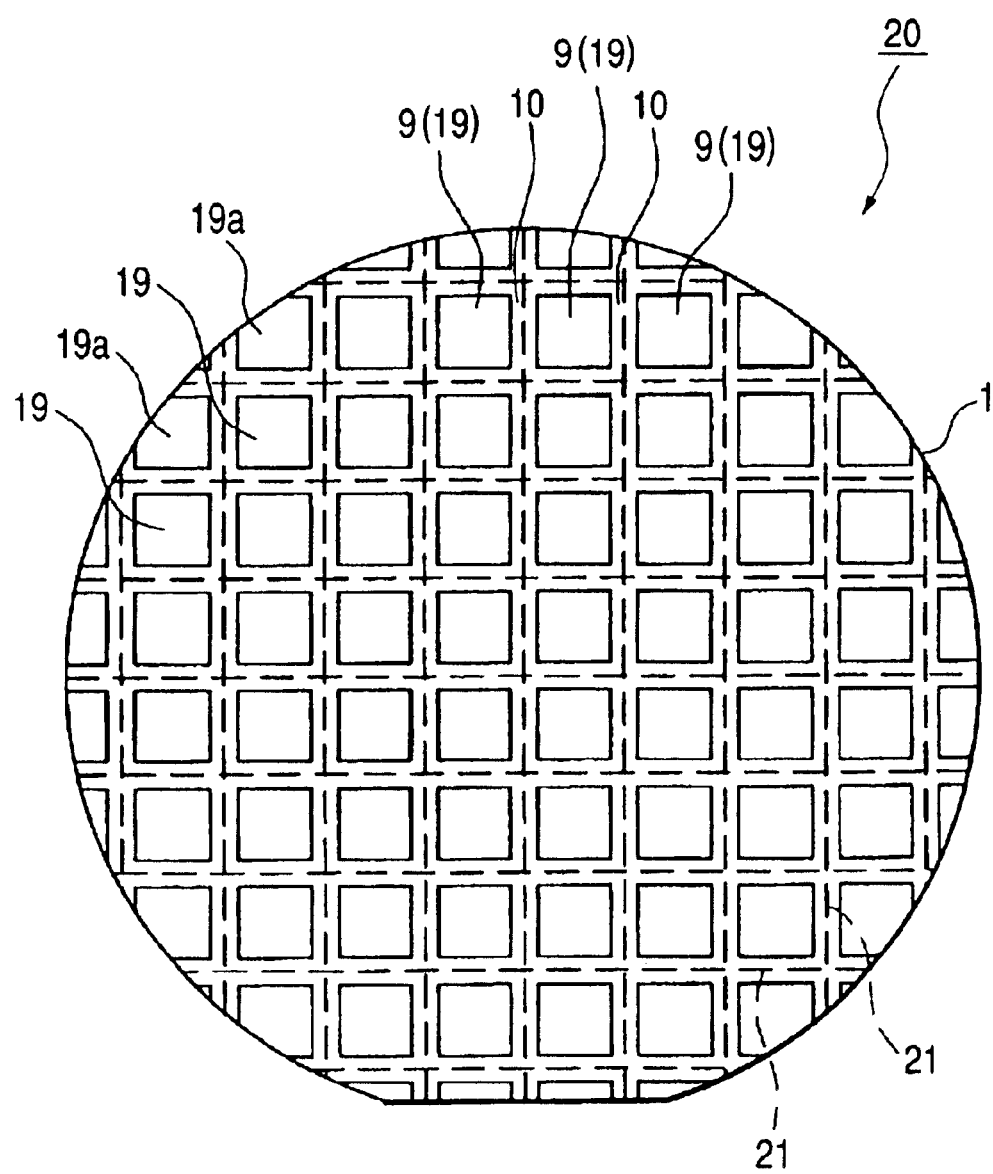
FIG. 6 is a plan view for conceptually showing the whole structure of the semiconductor device shown in FIG. 5.

FIG. 6 is a plan view conceptually showing the overall structure of the semiconductor device 20 shown in FIG. 6.

As shown in FIG. 6, a plurality of semiconductor elements 19 which are respectively formed on a plurality of semiconductor element forming regions 9 of the semiconductor wafer 1 are regularly arranged two-dimensionally. In the above-mentioned dicing step, the semiconductor wafer 1 is cut or diced along dicing lines 21 in the inside of scribe regions 10 between respective semiconductor elements 19 (semiconductor element forming regions 9). The dicing lines 21 are indicated by dotted lines in FIG. 6. Since the scribe regions 10 and the dicing lines 21 are present in a lattice shape or in a grid array with respect to the main surface of the semiconductor wafer 1, the semiconductor device 20 is diced in a grid array. Invalid chips (invalid semiconductor chips) formed of invalid semiconductor elements 19a which are formed on a peripheral portion of the semiconductor wafer 1 and do not have the complete structure as the semiconductor elements are removed after the dicing step. The semiconductor chips formed of normal semiconductor elements 19 other than the invalid chips are transferred to a next step, for example, an inspection step, a die bonding step or the like as effective chips after the dicing step.

In this embodiment, although the semiconductor element 19 corresponds to a region in which the components up to the insulation film 17 constituting a passivation film are formed, the semiconductor element 19 generally indicates a region which includes the components up to the protective film used as a passivation film. When the passivation film is not formed, the semiconductor element 19 corresponds to a region in which components up to the surface electrode made of aluminum or the like are formed. The semiconductor element forming region 9 corresponds to a region where the semiconductor element 19 is formed and corresponds to a region in which the components up to the insulation film 17 are formed as described above. Further, the scribe region 10 corresponds to, as shown in FIG. 5 and FIG. 6, a region which is sandwiched by neighboring semiconductor elements 19, that is, a region defined between the semiconductor element forming regions 9. Accordingly, the scribe region 10 corresponds to the region ranging from an end portion of the insulation film 17 of the semiconductor element 19 to an end portion of the insulation film 17 of another semiconductor element arranged close to the semiconductor element.

Figure 7:
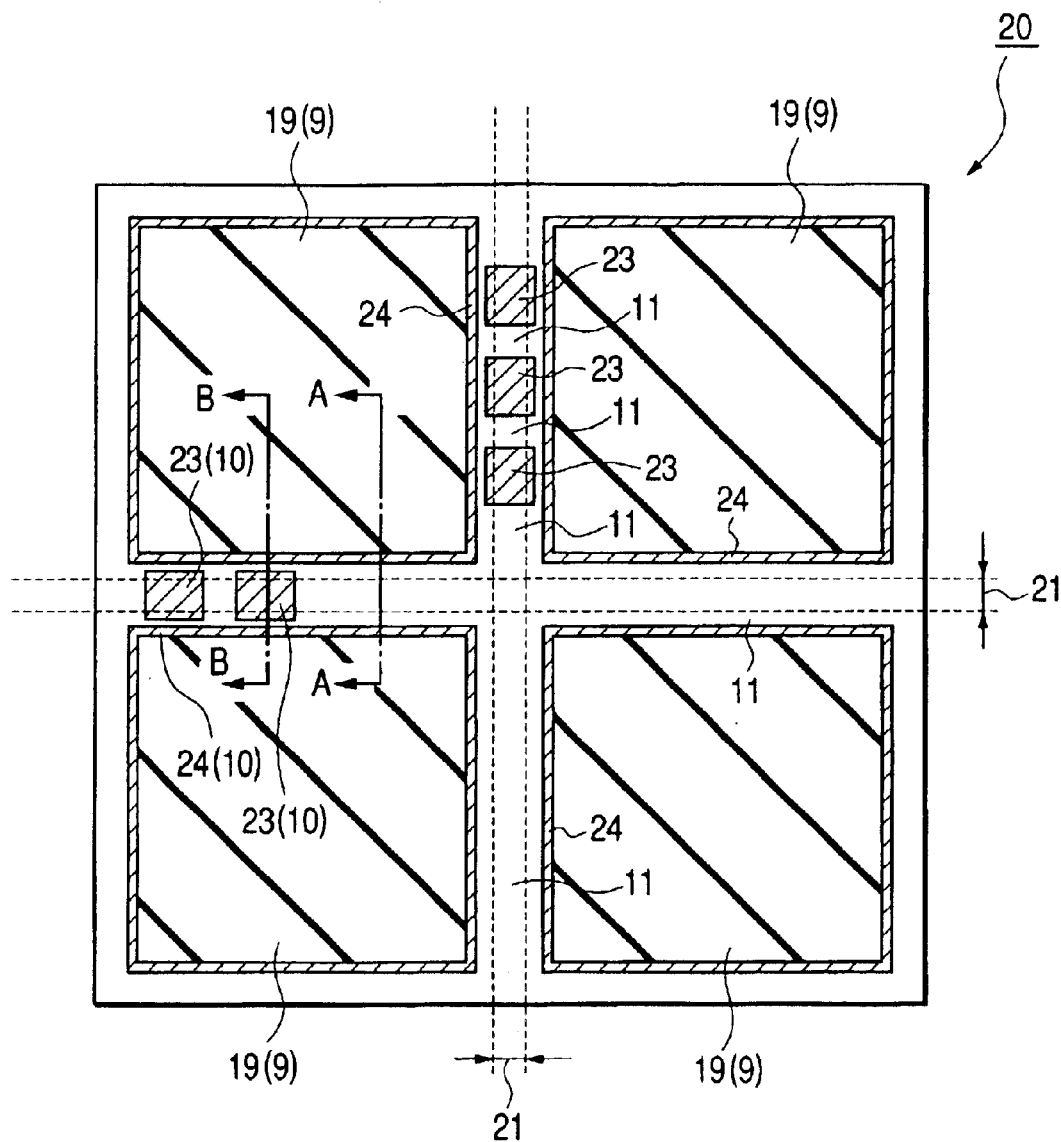
FIG. 7 is a partially enlarged plan view of the semiconductor device shown in FIG. 6.
Figure 8:
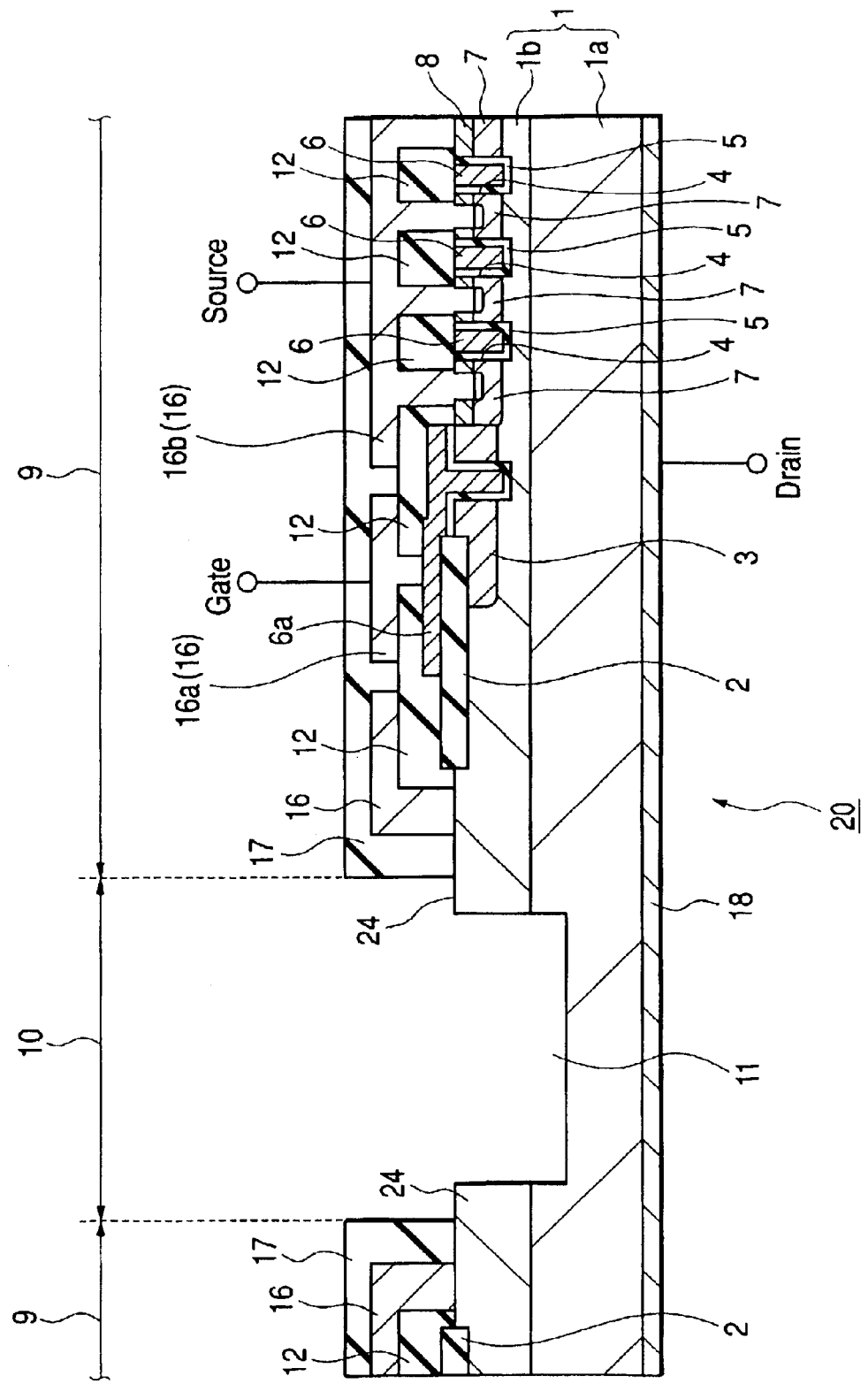
FIG. 8 is a cross-sectional view taken along a line A—A of FIG. 7.
Figure 9:
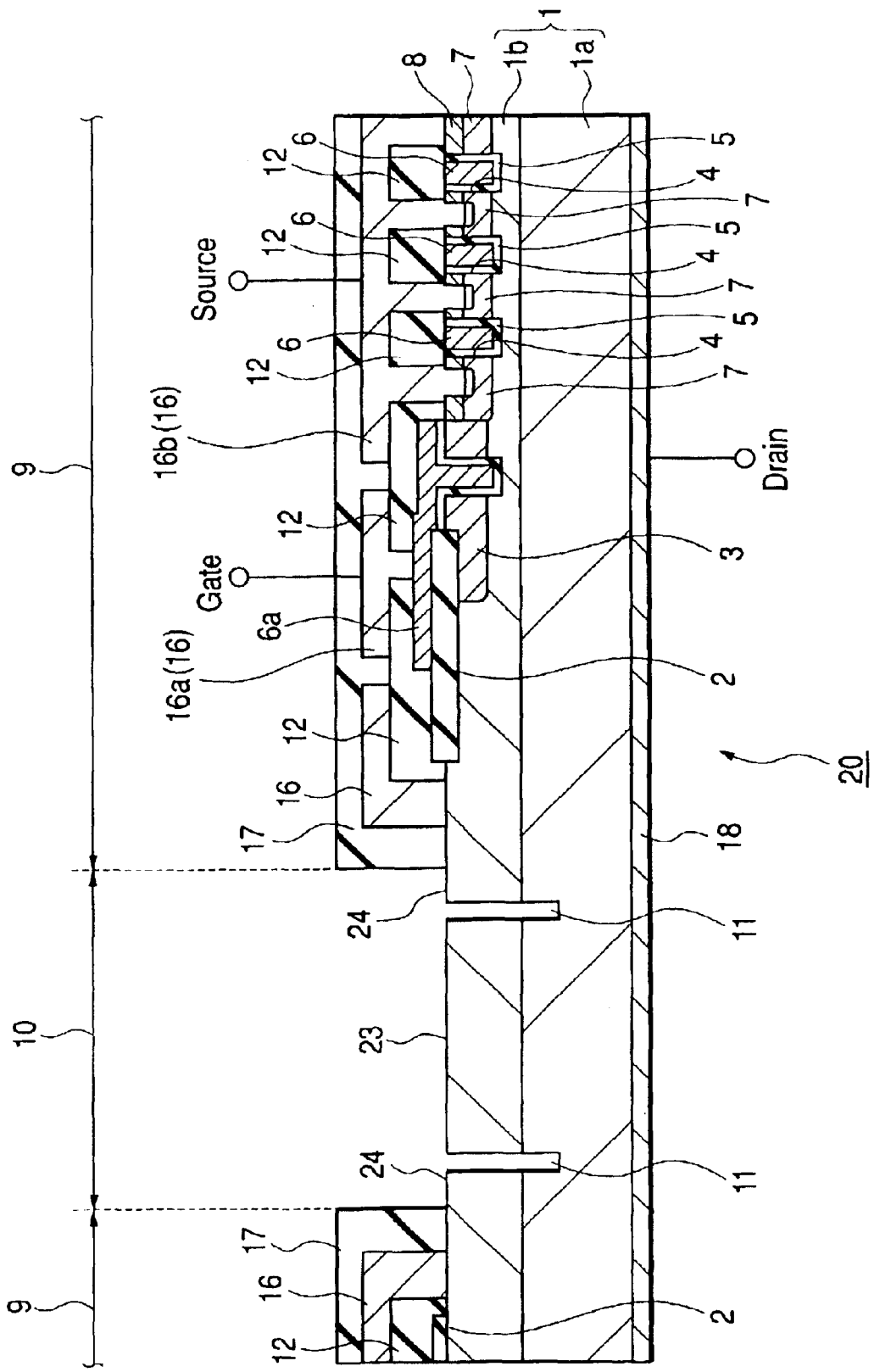
FIG. 9 is a cross-sectional view taken along a line B—B of FIG. 7.
Figure 10:
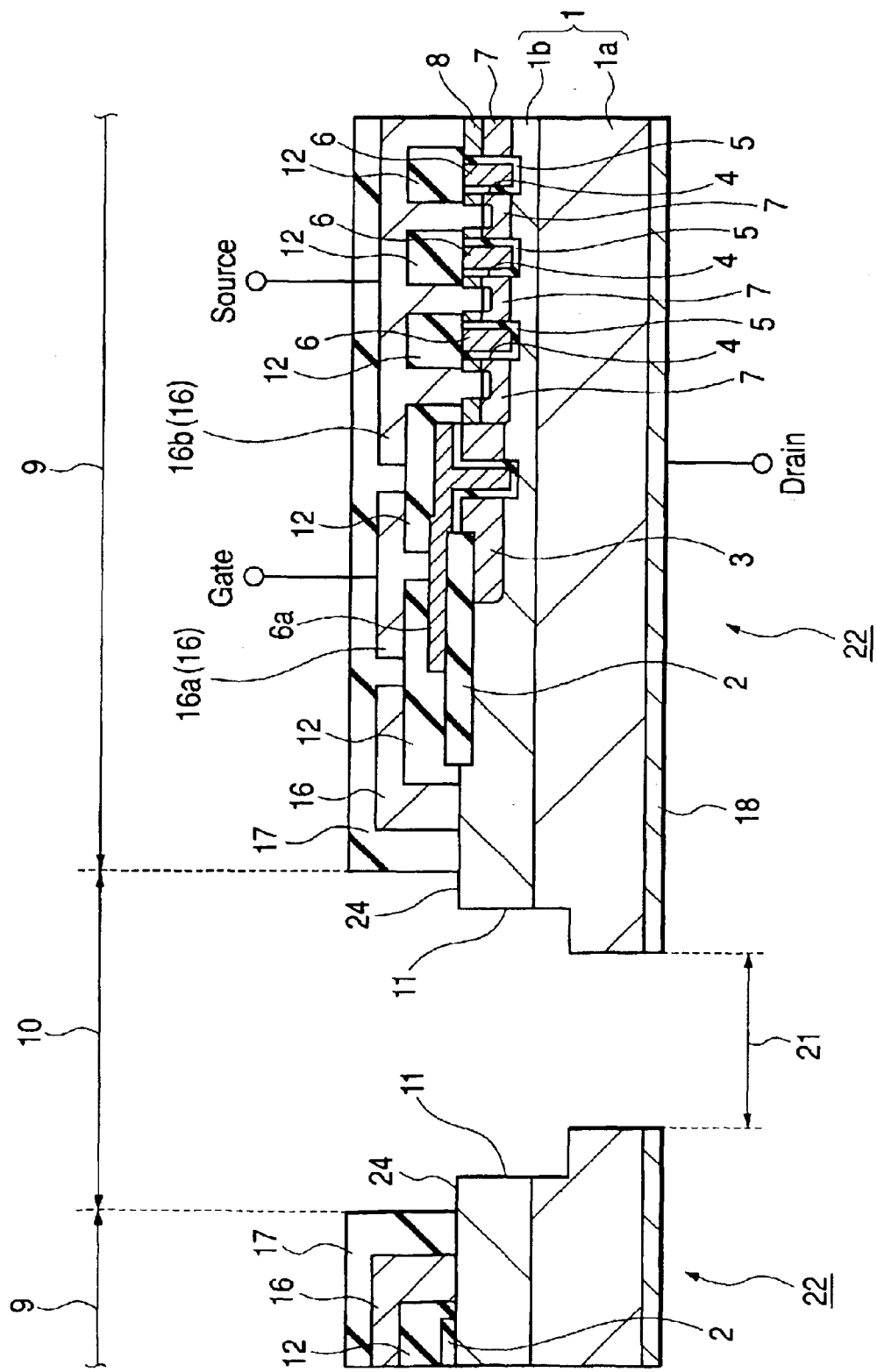
FIG. 10 is a cross-sectional view of an essential part in a manufacturing step of the semiconductor device which follows the manufacturing step shown in FIG. 8.
Figure 11:
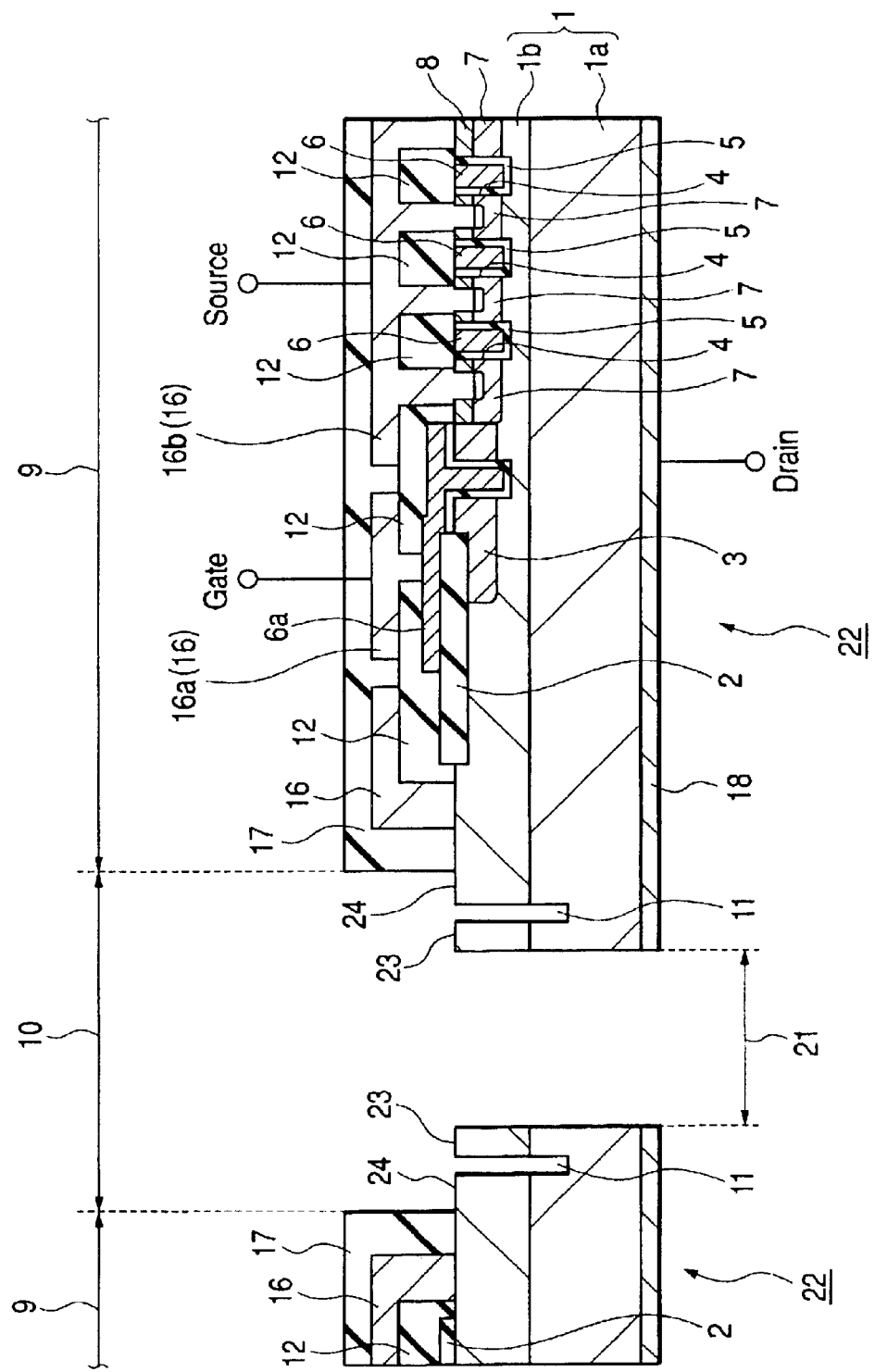
FIG. 11 is a cross-sectional view of an essential part in a manufacturing step of the semiconductor device which follows the manufacturing step shown in FIG. 9.
Figure 12:
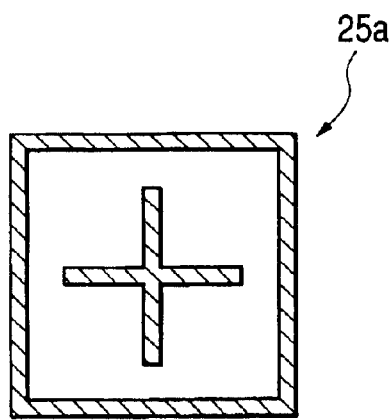
FIG. 12 is an explanatory view for showing an example of an alignment pattern of the semiconductor device which constitutes one embodiment of the present invention.
Figure 13:
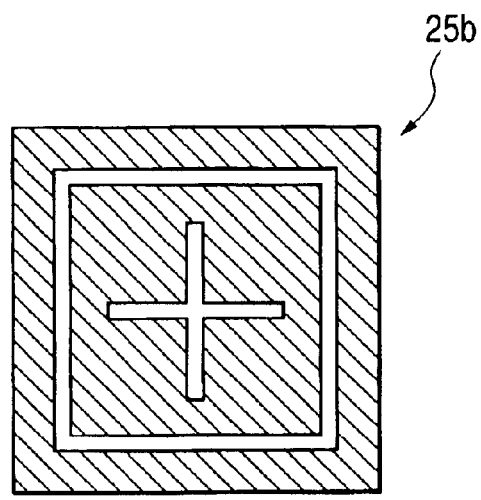
FIG. 13 is an explanatory view for showing an example of an alignment pattern of the semiconductor device which constitutes one embodiment of the present invention.
Figure 14:
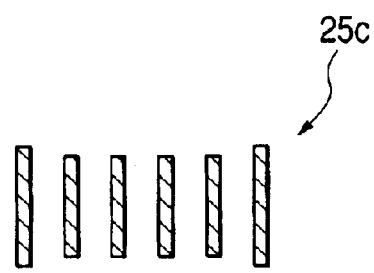
FIG. 14 is an explanatory view for showing an example of an alignment pattern of the semiconductor device which constitutes one embodiment of the present invention.
Figure 15:
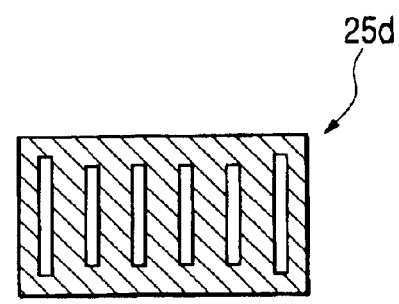
FIG. 15 is an explanatory view for showing an example of an alignment pattern of the semiconductor device which constitutes one embodiment of the present invention.

FIG. 7 is a partially enlarged plan view of the semiconductor device (semiconductor wafer) 20 shown in FIG. 6 and shows a region where four semiconductor elements 19 are formed. FIG. 8 is a cross-sectional view taken along a line A—A in FIG. 7 and corresponds to FIG. 5. FIG. 9 is a cross-sectional view taken along a line B—B in FIG. 7. Further, FIG. 10 and FIG. 11 respectively correspond to a cross-sectional view taken along a line A—A and a cross-sectional view taken along a line B—B after the semiconductor device 20 shown in FIG. 7 (FIG. 6) is diced. Accordingly, in FIG. 10 and FIG. 11, the semiconductor device 20 is divided into a plurality of semiconductor chips 22. Here, although the dicing lines 21 between four semiconductor elements 19 are indicated by dotted lines in FIG. 7, the dicing lines 21 in the peripheries of four semiconductor elements 19 are omitted from the drawing for facilitating the understanding.

As shown in FIG. 7 to FIG. 11, the grooves 11 are formed in the scribe regions 10 between the semiconductor elements 19. The grooves 11 are formed in an approximately grid array with respect to a main surface of the semiconductor wafer 1. A width of the groove 11 (a width in a plane perpendicular to the extending direction of the scribe region 10 or the groove 11) is larger than a width of the dicing line (a region ground by a dicing saw or the like) in the dicing step.

In this embodiment, the grooves 11 are formed in the scribe regions 10 other than alignment pattern forming regions 23 such that the alignment pattern forming regions 23 remain within the scribe regions 10.

Here, the alignment pattern forming regions 23 are regions where an alignment pattern (or alignment marks) used for photolithography steps or the like is formed or regions for forming such an alignment pattern. The alignment pattern forming regions 23 may be either regions in which the alignment pattern is already formed at a stage in which the grooves 11 are formed or regions in which the alignment pattern is expected to be formed after the grooves 11 are formed. In the alignment pattern forming regions 23, not to mention the alignment pattern which is used in the photolithography step (or the exposure step), it is also possible to form the alignment pattern which can be used in steps other than the photolithography step. Further, a TEG (Test Element Group) pattern for ensuring the wafer process may be formed in the alignment pattern forming regions 23. These regions are referred to as the alignment pattern forming regions 23 in this embodiment.

As can be understood from FIG. 7 to FIG. 9, in this embodiment, in the scribe regions 10, the grooves 11 are formed such that the alignment pattern forming regions 23 remain like islands in the grooves 11. That is, the alignment pattern forming regions 23 are spaced apart from non-groove regions (regions which are not etched by the groove 11 forming step in the scribe region 10) 24 which remain at both sides of the groove 11 such that the alignment pattern forming regions 23 are neither connected with nor in continuity with the non-groove regions 24. Such a structure, for example, can be formed, at the time of forming the grooves 11 in the semiconductor wafer 1 by a photolithography method or an etching method, by etching the semiconductor wafer 1 in a state that regions outside the groove 11 (corresponding to the non-groove regions 24 and the semiconductor element forming region 9) and the alignment pattern forming regions 23 inside the groove 11 are covered with a photo resist pattern and regions where the groove 11 is to be formed are exposed. Accordingly, the regions where the groove 11 is to be formed are etched, while the alignment pattern forming regions 23 (regions in which the groove including the alignment pattern forming regions 23 should not be formed) remain without being etched.

The alignment pattern (or alignment marks) formed in the alignment pattern forming regions 23 is a pattern (marks) which is formed on the semiconductor wafer or on a material layer or the like above the semiconductor wafer for alignment and any arbitrary pattern shape which can be used as the alignment pattern can be selected. For example, the alignment patterns 25a to 25d having pattern shapes illustrate in FIG. 12 to FIG. 15 can be used.

Further, the size and the dimension of the alignment pattern forming regions 23 can be selected corresponding to the size of alignment pattern formed in the alignment pattern forming regions 23. It is preferable that the size and the dimension of the alignment pattern forming regions 23 are equal to or larger than the size of the alignment pattern. Accordingly, the alignment pattern forming region 23 includes a region extending to an outer peripheral portion of the alignment pattern and, when necessary, may include an inhibition region of given width around the alignment pattern. For example, when the size of the alignment pattern corresponds to a rectangular region of 80 $\mu$m×40 $\mu$m, the size of the alignment pattern forming region 23 may be set, for example, to the rectangular region of 120 $\mu$m×80 $\mu$m including the inhibition regions having a width of 20 $\mu$m, for example.

Further, the positions of the alignment pattern forming regions 23 can be set to any arbitrary positions in the scribe region 10 and the number of the alignment pattern forming regions 23 can be selected depending on the necessity. When a plurality of alignment pattern forming regions 23 are formed, the respective alignment pattern forming regions 23 may have the same size or the different sizes.

Further, in forming the alignment pattern which can be used in the photolithography step, the alignment pattern forming regions 23 can be formed for every shot region of the exposure step (region exposed by one shot).

Further, it is enough that the groove 11 is formed in the scribe region 10 such that the alignment pattern forming regions 23 remain inside the scribe region 10. Further, various regions which are necessary in manufacturing steps other than the step of manufacturing the alignment pattern forming regions 23 may remain in the scribe region 10.

According to this embodiment, since a large number of grooves 11 in an approximately grid array are formed on the main surface of the semiconductor wafer 1, it is possible to disperse or attenuate stress which is attributed to the difference of thermal expansion rate between the semiconductor wafer 1 and the surface aluminum electrode (the gate electrode 16a and the source line 16b) in the surface of the semiconductor wafer 1. Accordingly, the occurrence of a warp of the semiconductor wafer 1 can be largely prevented so that the accurate alignment in the photolithography step can be realized. Further, the occurrence of break-down or cracks during transfer of the semiconductor device between respective steps can be prevented so that a manufacturing yield rate of the semiconductor devices can be enhanced. Accordingly, it is possible to reduce a manufacturing cost of the semiconductor device or the semiconductor chip.

Further, since a warp of the semiconductor wafer 1 can be reduced, even when the semiconductor wafer 1 (semiconductor device 20) which is adhered to a tacky adhesive tape is stretched in the dicing step, the stress applied to the semiconductor wafer 1 can be reduced. Further, by forming the groove 11 in the scribe region 10, the stress that a dicing blade applies to the semiconductor wafer 1 in the dicing step is applied perpendicular to the semiconductor wafer 1 by way of the groove 11. Accordingly, it is possible to prevent the occurrence of chipping or chip cracks.

Further, the groove 11 is formed such that the alignment pattern forming regions 23 remain in the scribe region 10 and hence, it is possible to easily and accurately form the alignment pattern or the TEG pattern on the alignment pattern forming region 23 of the scribe region 10. It is also possible to easily and accurately perform reading of the alignment pattern formed on the alignment pattern forming regions 23. Accordingly, the alignment of high accuracy can be realized and hence, the present invention can cope with the fine processing or the like. The manufacturing yield rate of the semiconductor device can be also enhanced. Further, it is unnecessary to form the alignment pattern or the TEG pattern on the semiconductor element forming region 9. Accordingly, it is possible to manufacture a large number of semiconductor chips from a sheet of semiconductor wafer.

Further, the TFG can be mounted when necessary and, at the same time, it is also possible to perform checking of steps when necessary in the manufacturing steps of the semiconductor device (particularly, the step for forming the semiconductor elements 19 on the semiconductor wafer 1). Accordingly, when a problem arises with respect to the manufacturing process, it is possible to find out a cause of the problem and to solve the problem speedily. Therefore, the throughput is enhanced and the manufacturing cost of the semiconductor device or the semiconductor chips can be reduced.

Embodiment 2

Figure 16:
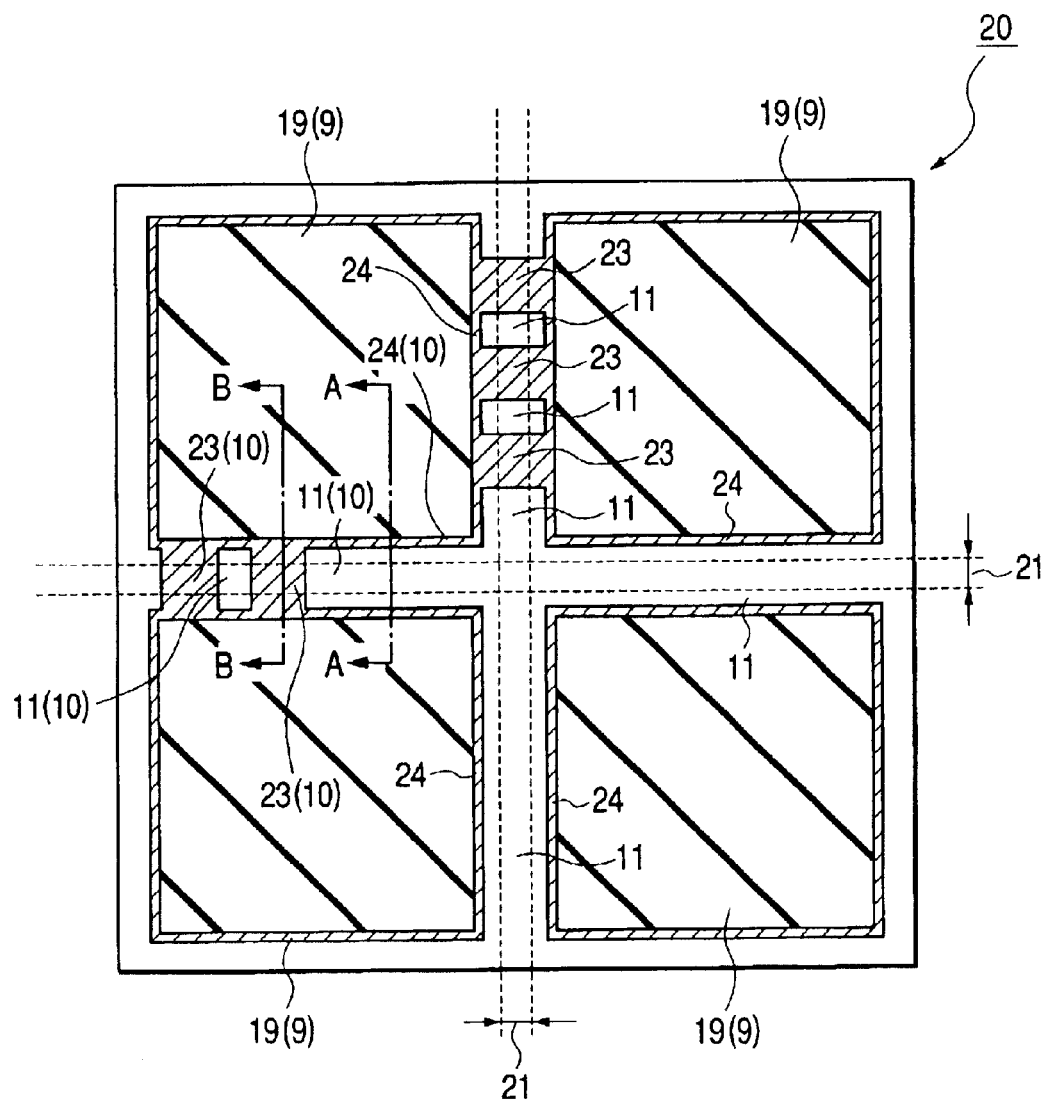
FIG. 16 is a partially enlarged plan view of a manufacturing step of the semiconductor device according to another embodiment of the present invention.
Figure 17:
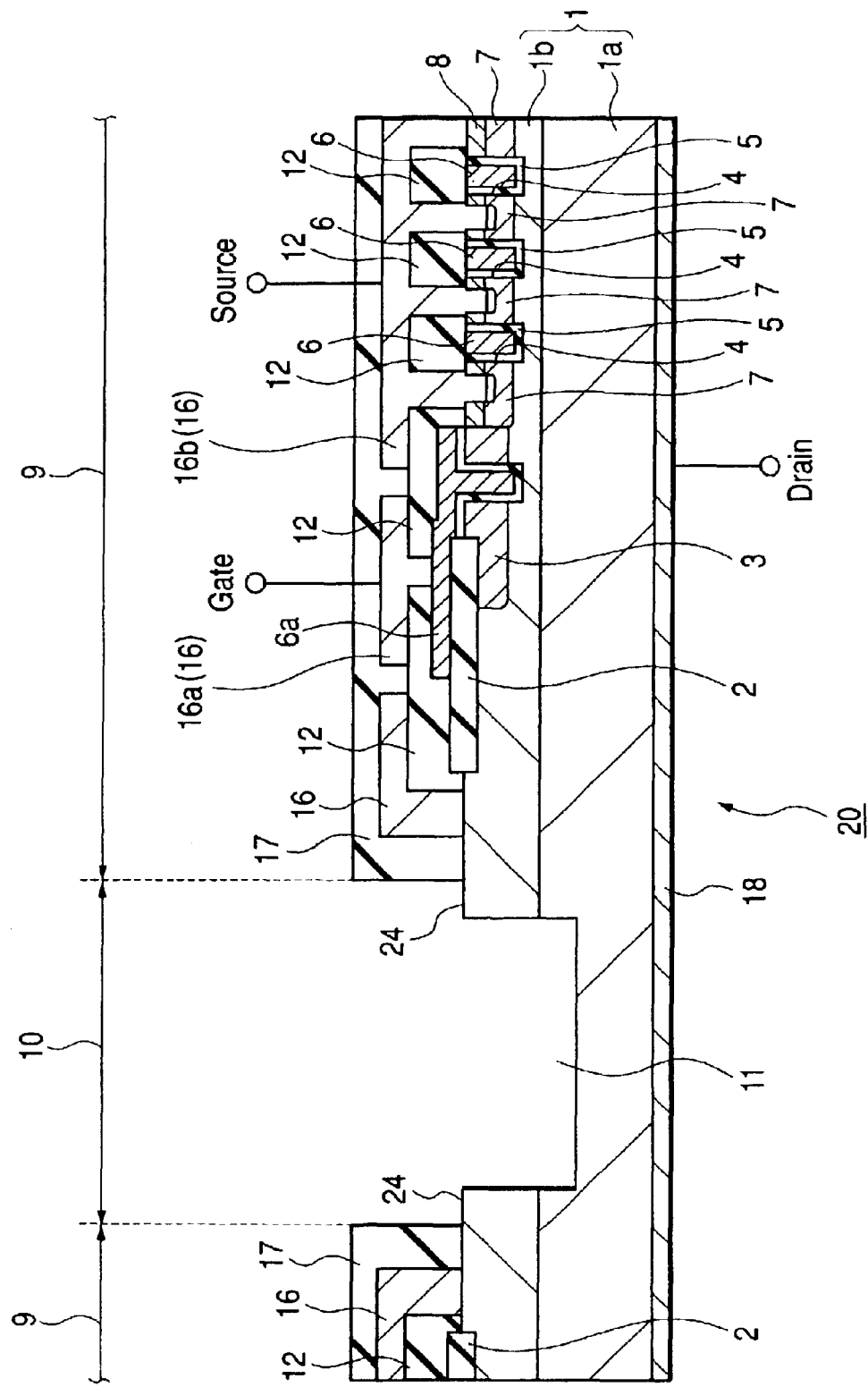
FIG. 17 is a cross-sectional view taken along a line A—A of FIG. 16.
Figure 18:
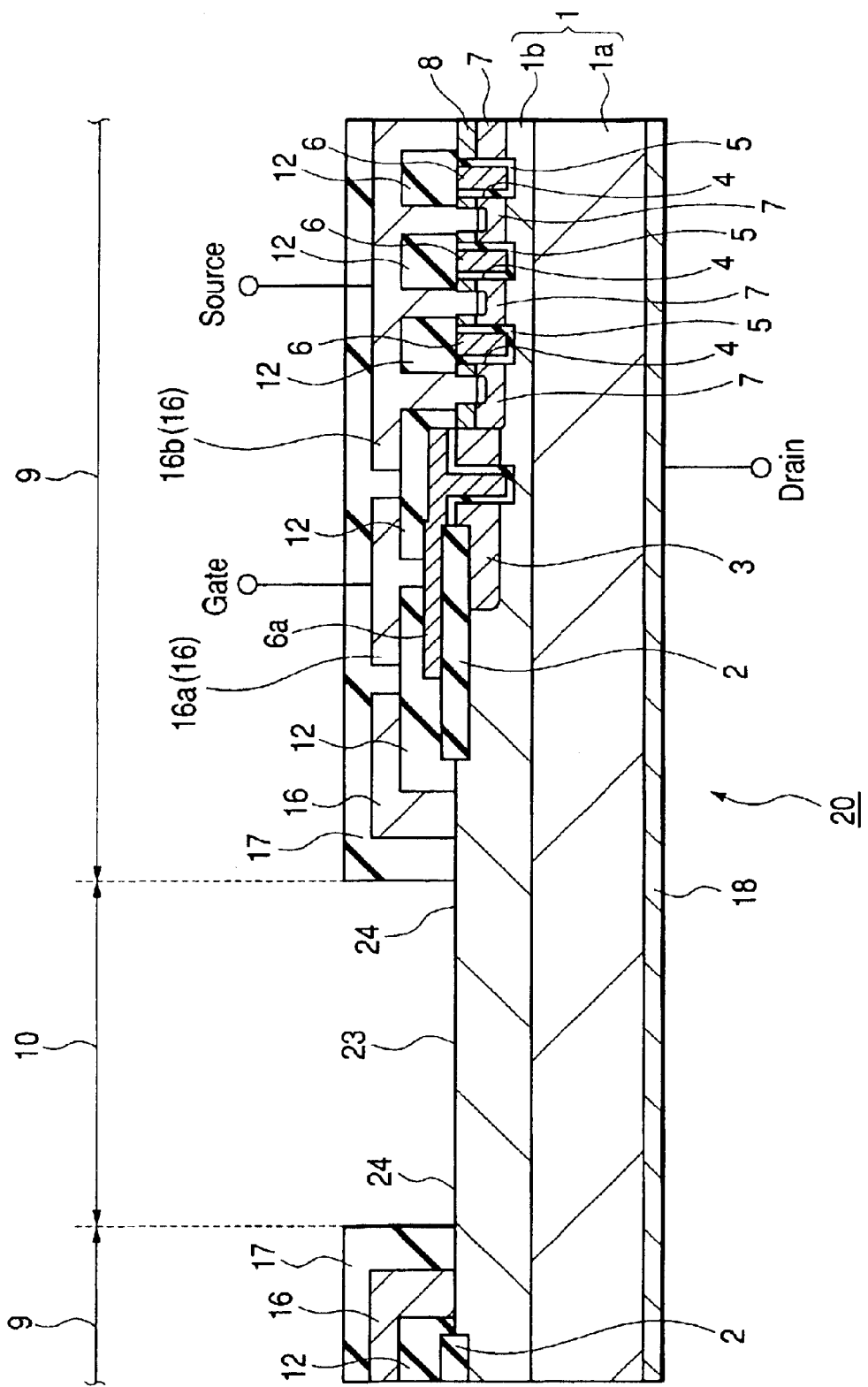
FIG. 18 is a cross-sectional view taken along a line B–B of FIG. 16.
Figure 19:
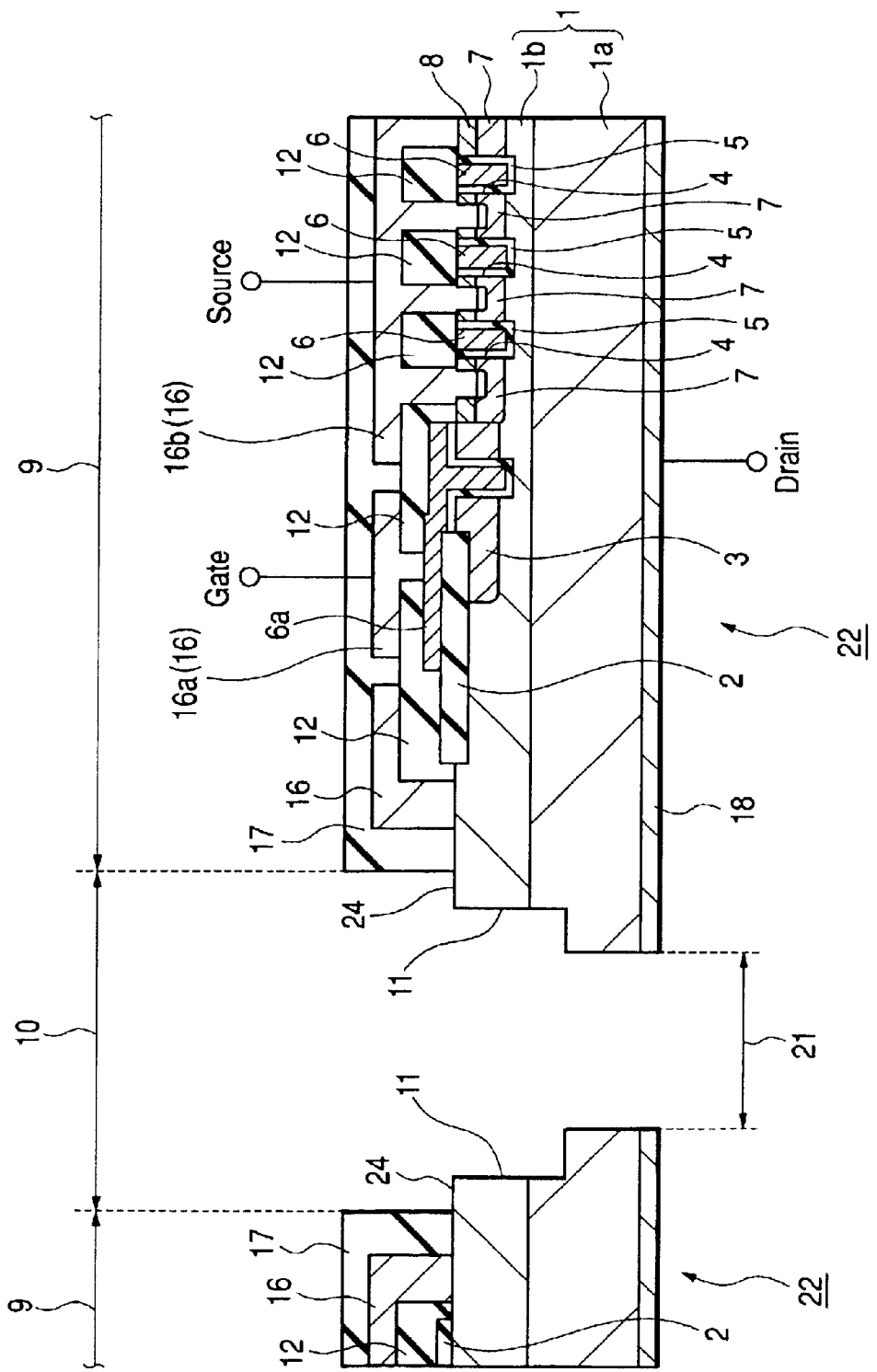
FIG. 19 is a cross-sectional view of an essential part in a manufacturing step of the semiconductor device which follows the manufacturing step shown in FIG. 17.
Figure 20:
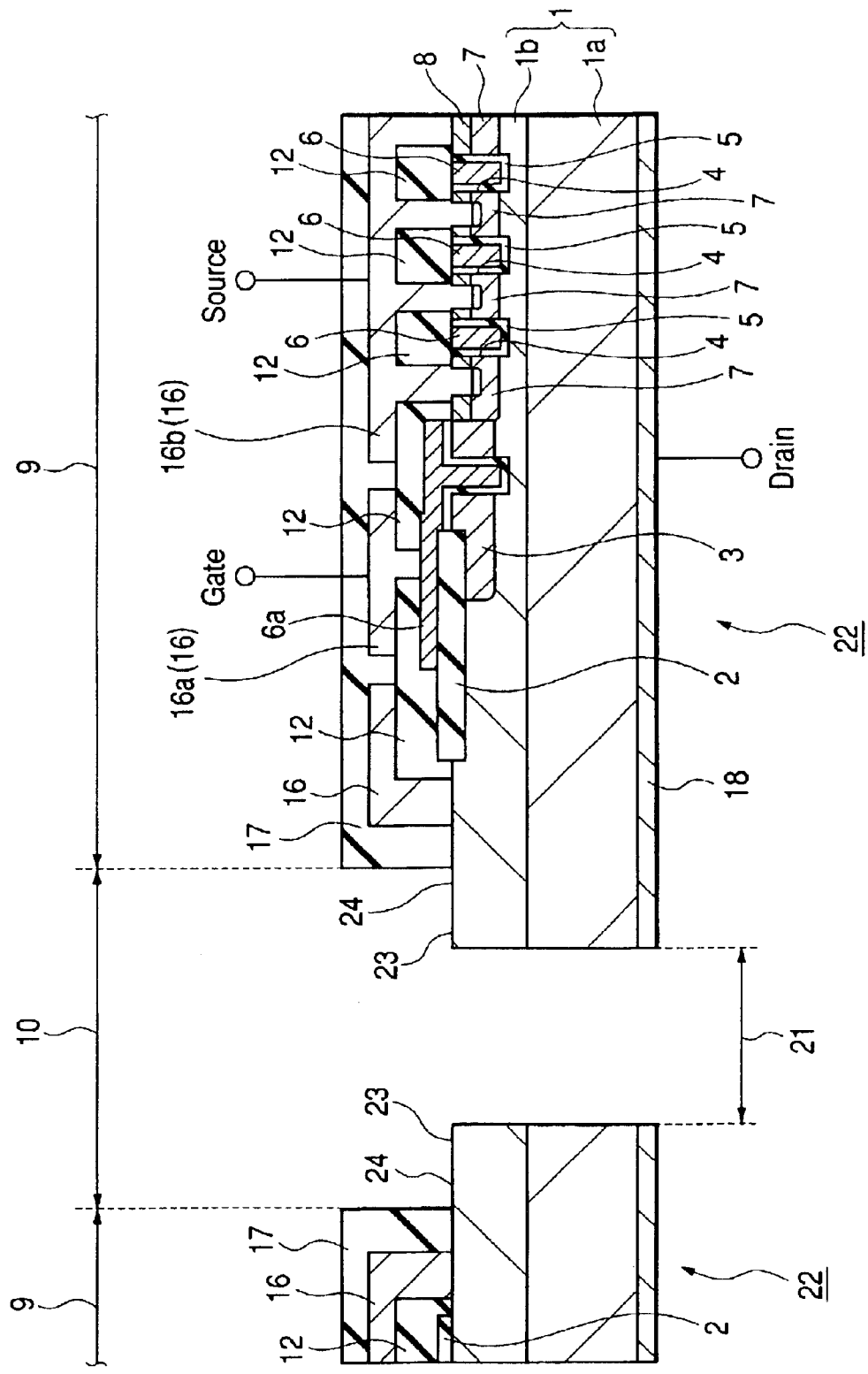
FIG. 20 is a cross-sectional view of an essential part in a manufacturing step of the semiconductor device which follows the manufacturing step shown in FIG. 18.

FIG. 16 is a partially enlarged plan view of a semiconductor device (semiconductor wafer) of another embodiment of the present invention and corresponds to the FIG. 7 in the above-mentioned embodiment 1. FIG. 17 is a cross-sectional view taken along a line A—A in FIG. 16. FIG. 18 is a cross-sectional view taken along a line B—B in FIG. 16. Further, FIG. 19 and FIG. 20 respectively correspond to a cross-sectional view taken along a line A—A and a cross-sectional view taken along a line B—B after the semiconductor device shown in FIG. 16 is diced. Accordingly, FIG. 16 to FIG. 20 respectively correspond to FIG. 7 to FIG. 11 of the above-mentioned embodiment 1.

Also in this embodiment, the groove 11 is formed in the scribe region 10 other than the alignment pattern forming regions 23 such that the alignment pattern forming regions 23 remain inside the scribe region 10. However, different from the above-mentioned embodiment 1, as can be understood from FIG. 16 and FIG. 18, the alignment pattern forming regions 23 are formed like bridges with respect to the groove 11. That is, the alignment pattern forming regions 23 are formed such that the alignment pattern forming regions 23 are connected with or in continuity with the non-groove regions 24 of the scribe region 10 which remain at both sides of the groove 11 (regions which are not etched in the groove 11 forming step out of the scribe region 10). Since other structures and manufacturing steps of the semiconductor device in this embodiment are substantially equal to those of the above-mentioned embodiment 1, the explanation thereof is omitted here.

Embodiment 3

Figure 21:
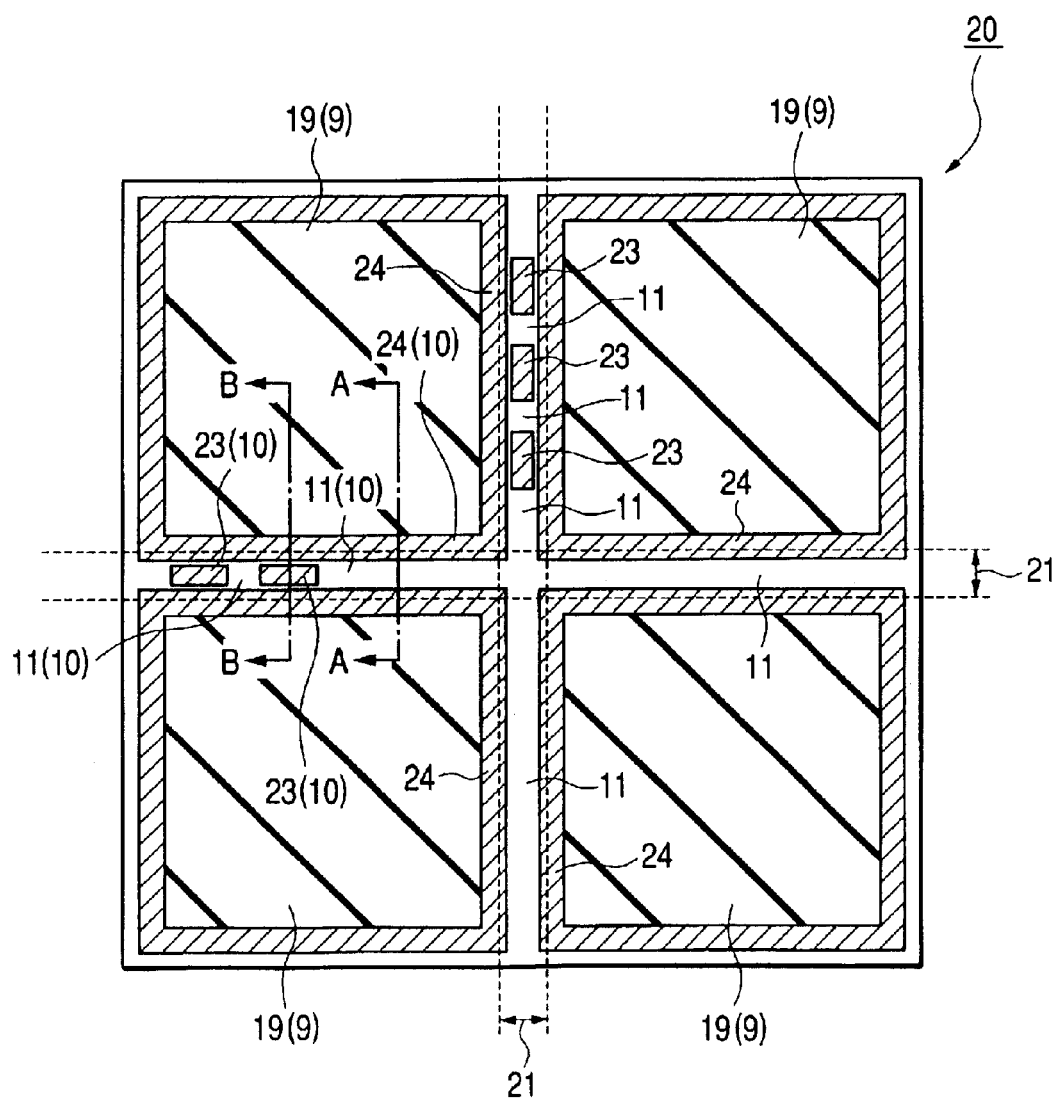
FIG. 21 is a partially enlarged plan view of a manufacturing step of the semiconductor device according to another embodiment of the present invention.
Figure 22:
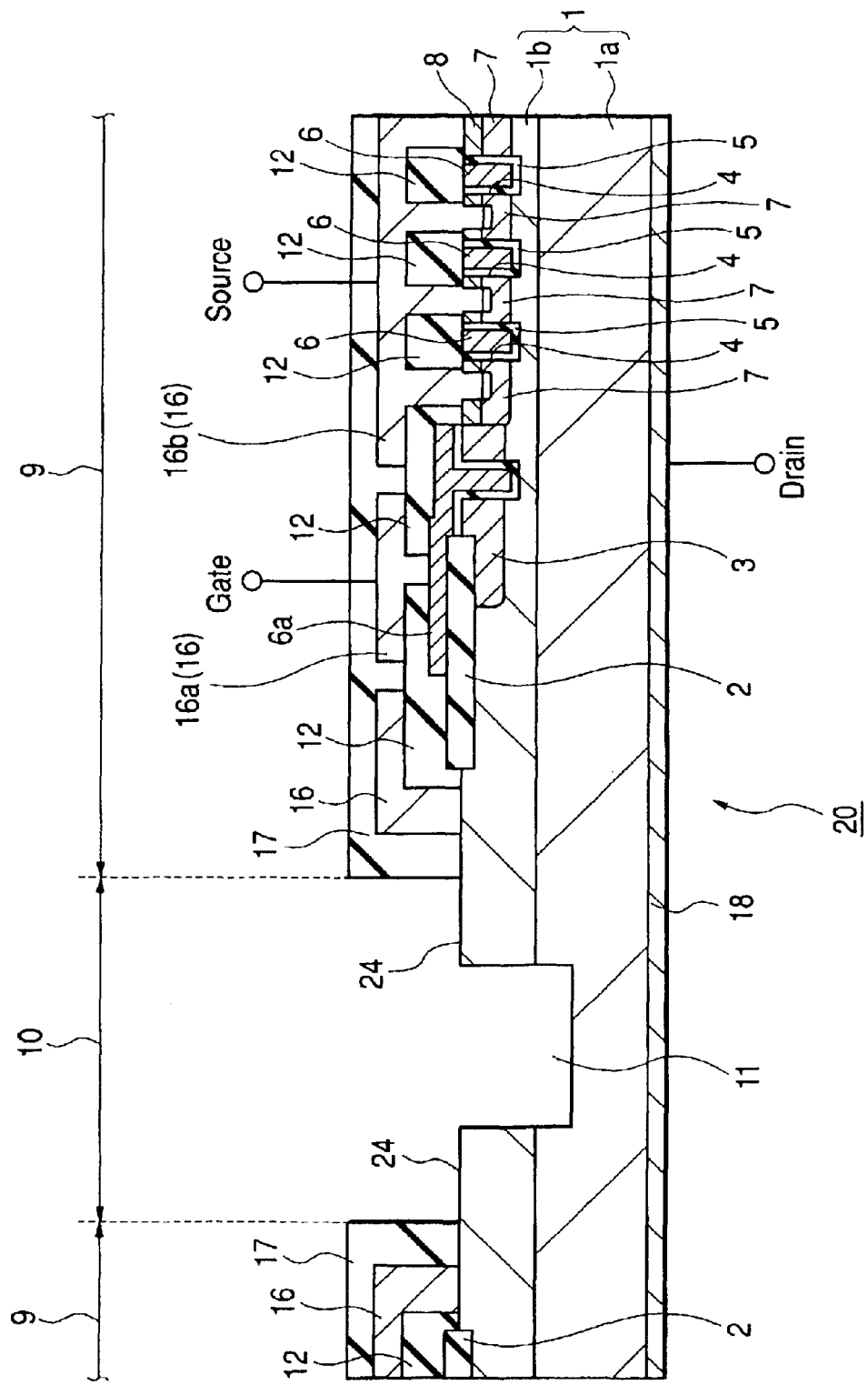
FIG. 22 is a cross-sectional view taken along a line A—A of FIG. 21.
Figure 23:
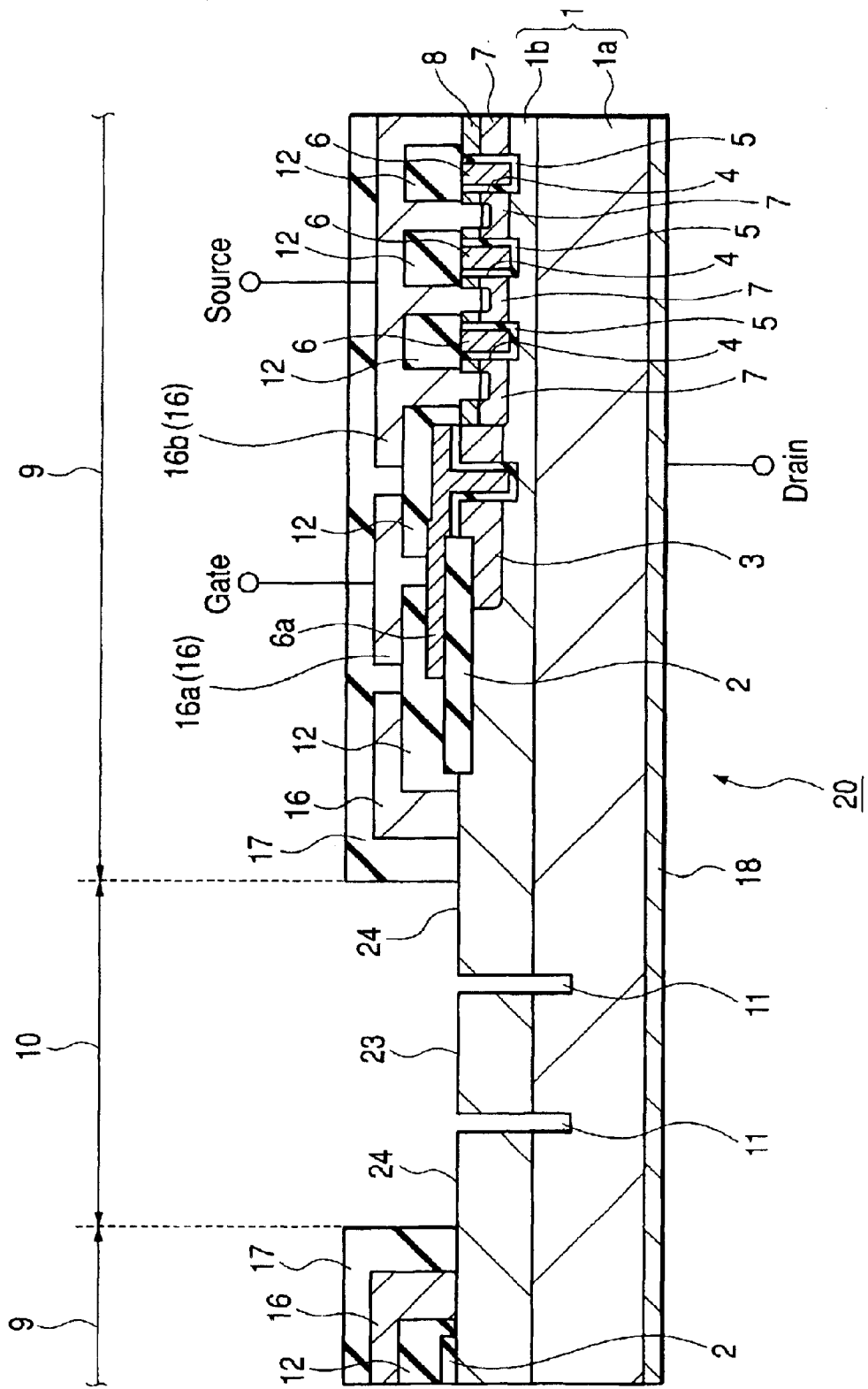
FIG. 23 is a cross-sectional view taken along a line B—B of FIG. 21.
Figure 24:
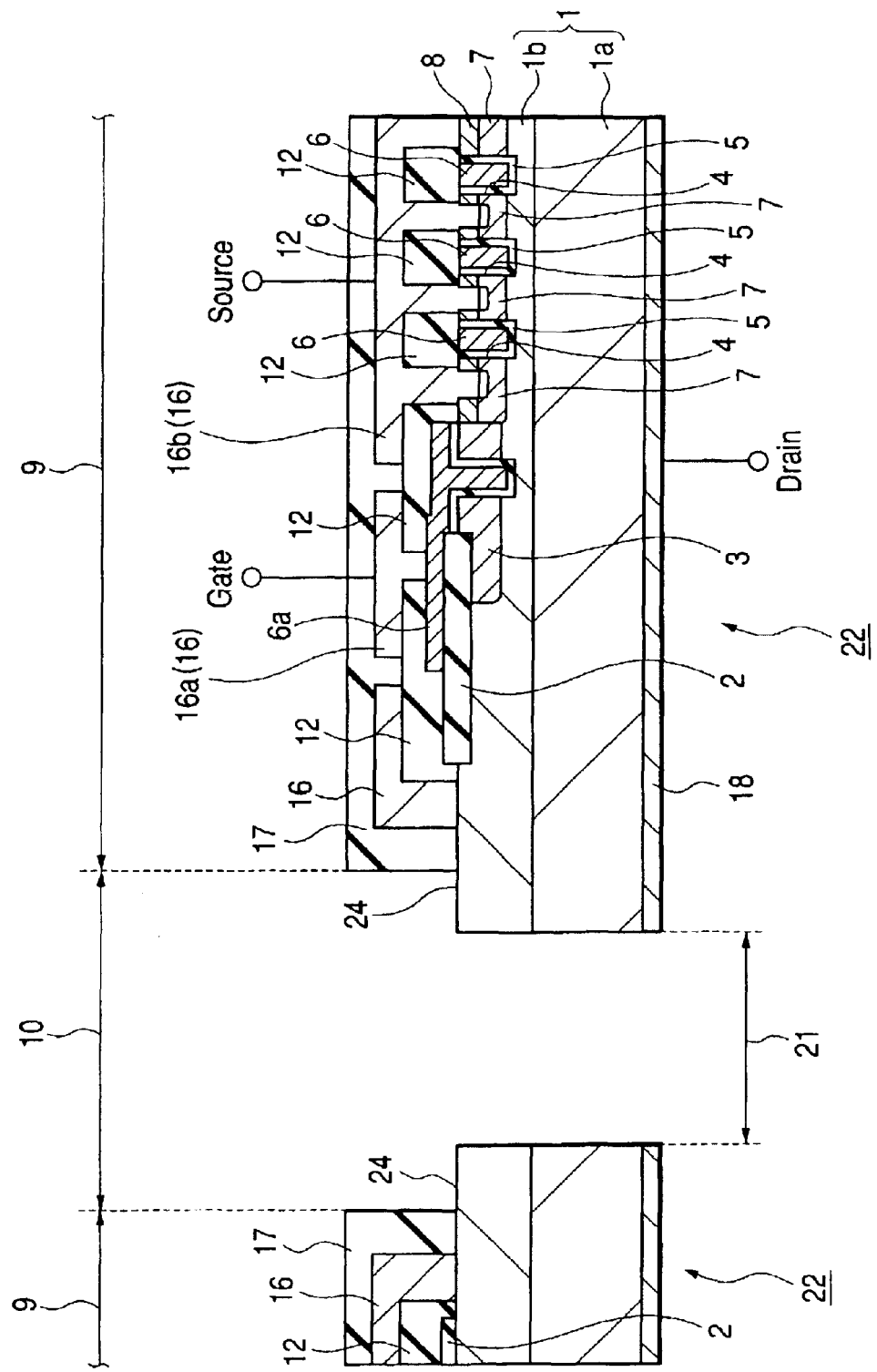
FIG. 24 is a cross-sectional view of an essential part in a manufacturing step of the semiconductor device which follows the manufacturing step shown in FIG. 22.
Figure 25:
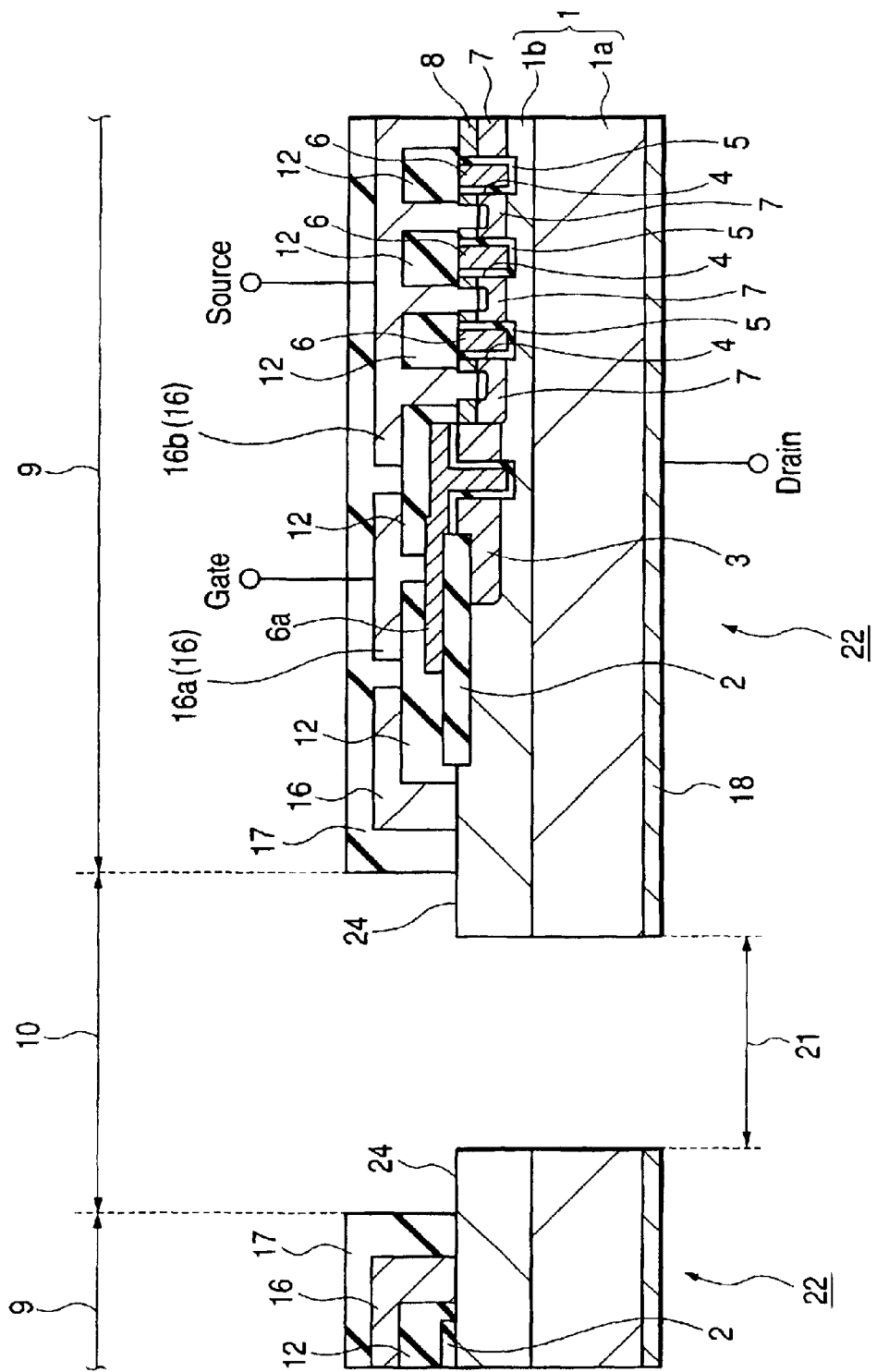
FIG. 25 is a cross-sectional view of an essential part in a manufacturing step of the semiconductor device which follows the manufacturing step shown in FIG. 23.

FIG. 21 is a partially enlarged plan view of a semiconductor device of still another embodiment of the present invention and corresponds to FIG. 7 in the above-mentioned embodiment 1. FIG. 22 is a cross-sectional view taken along a line A—A in FIG. 21. FIG. 23 is a cross-sectional view taken along a line B—B in FIG. 21. Further, FIG. 24 and FIG. 25 respectively correspond to a cross-sectional view taken along a line A—A and a cross-sectional view taken along a line B—B after the semiconductor device shown in FIG. 21 is diced. Accordingly, FIG. 21 to FIG. 25 respectively correspond to FIG. 7 to FIG. 11 of the above-mentioned embodiment 1.

Also in this embodiment, the groove 11 is formed in the scribe region 10 other than the alignment pattern forming regions 23 such that the alignment pattern forming regions 23 remain inside the scribe region 10. However, different from the above-mentioned embodiment 1, the groove 11 is formed such that a width of the groove 11 is narrower than a width of the dicing line (region ground by the dicing saw or the like) 21 in the dicing step. Since other structures and manufacturing steps of the semiconductor device in this embodiment are substantially equal to those of the above-mentioned embodiment 1, the explanation thereof is omitted here.

Embodiment 4

Figure 26:
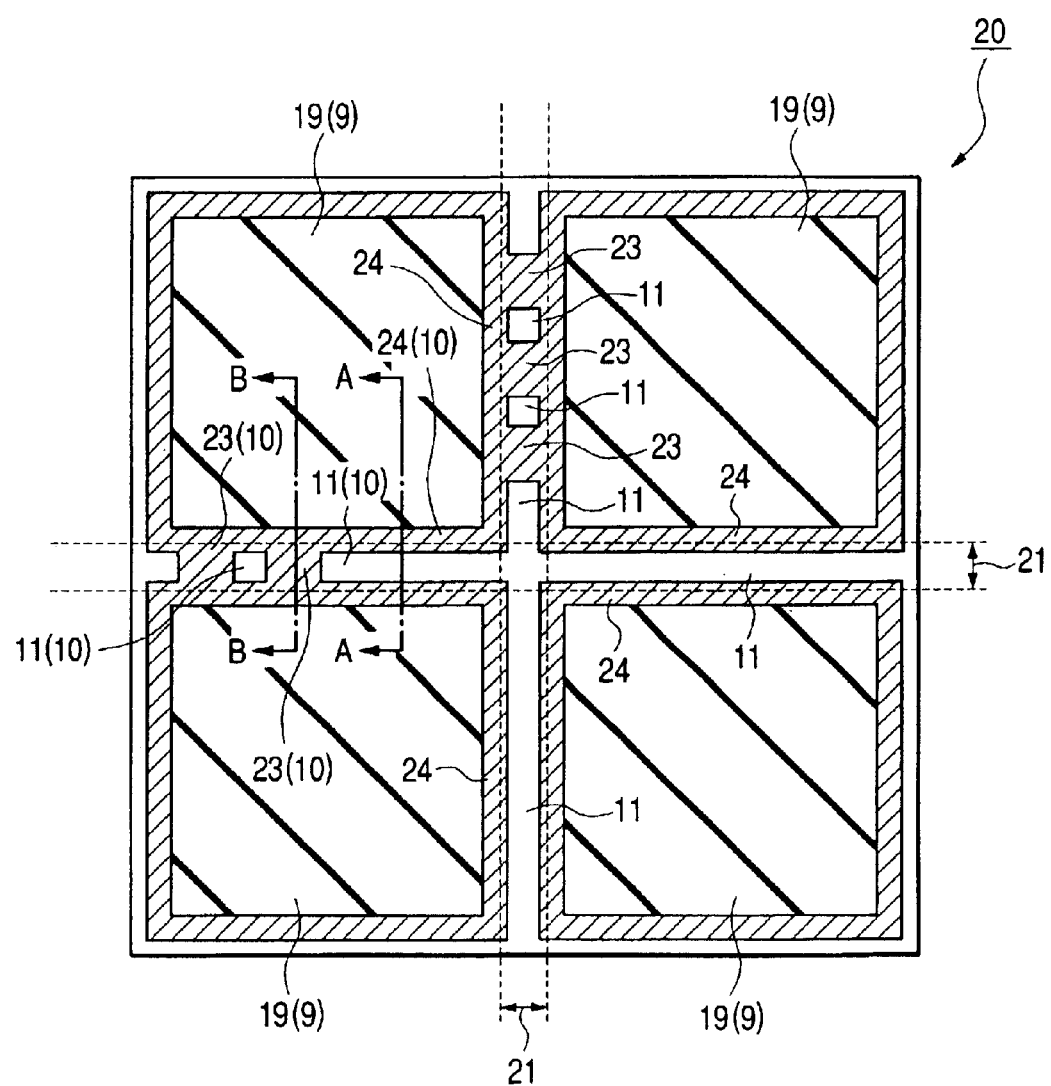
FIG. 26 is a partially enlarged plan view of a manufacturing step of the semiconductor device according to another embodiment of the present invention.
Figure 27:
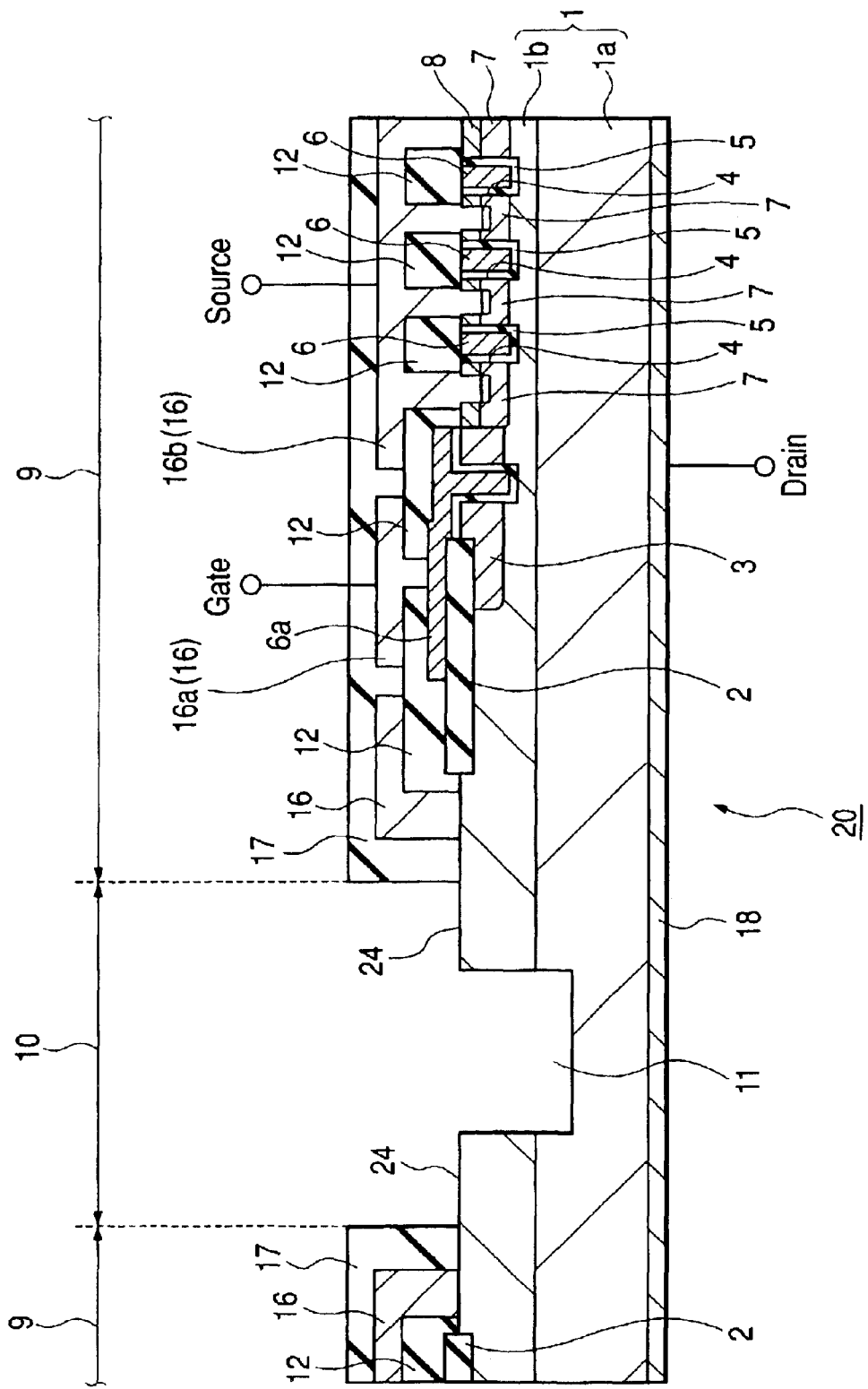
FIG. 27 is a cross-sectional view taken along a line A—A of FIG. 26.
Figure 28:
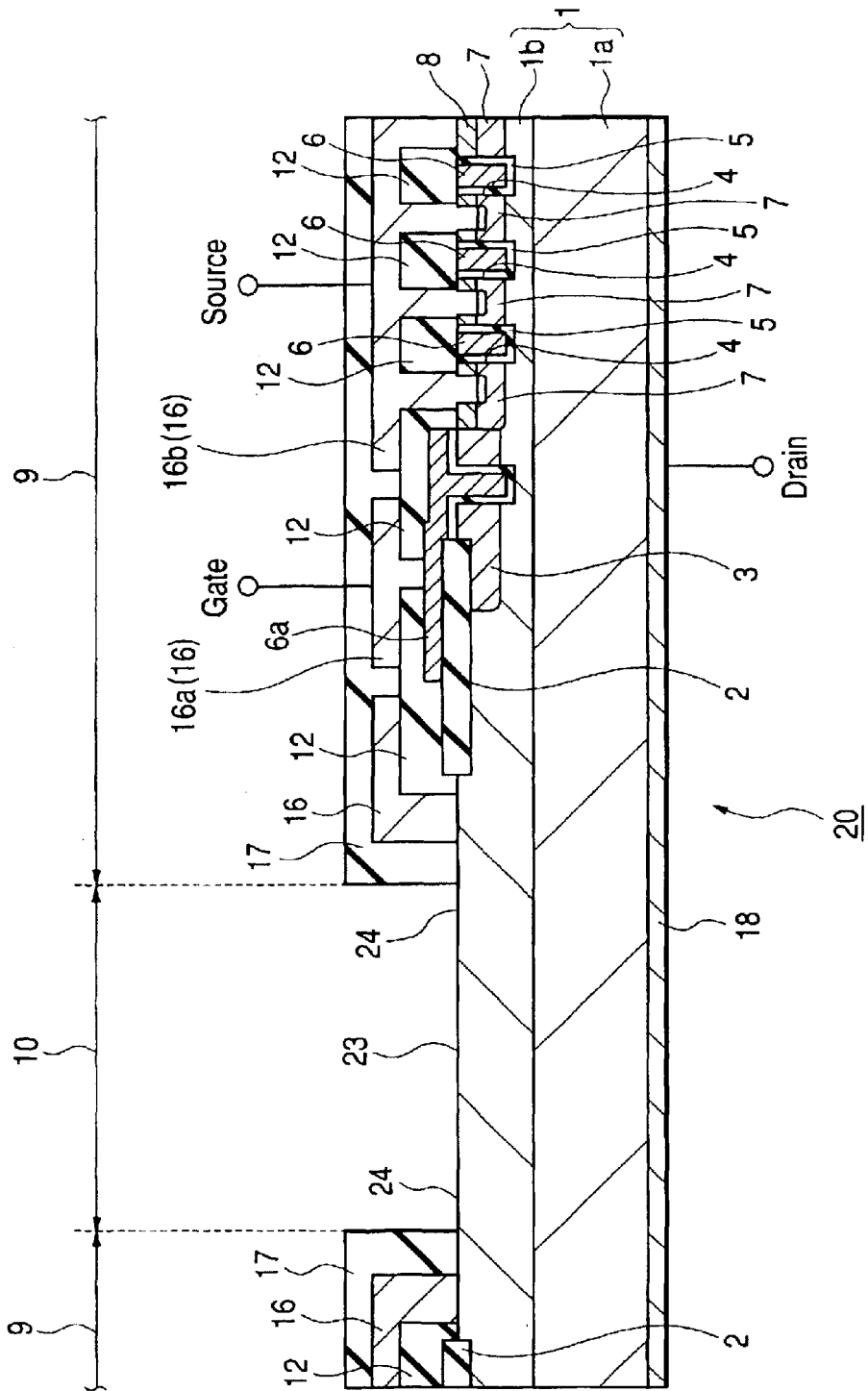
FIG. 28 is a cross-sectional view taken along a line B—B of FIG. 26.
Figure 29:
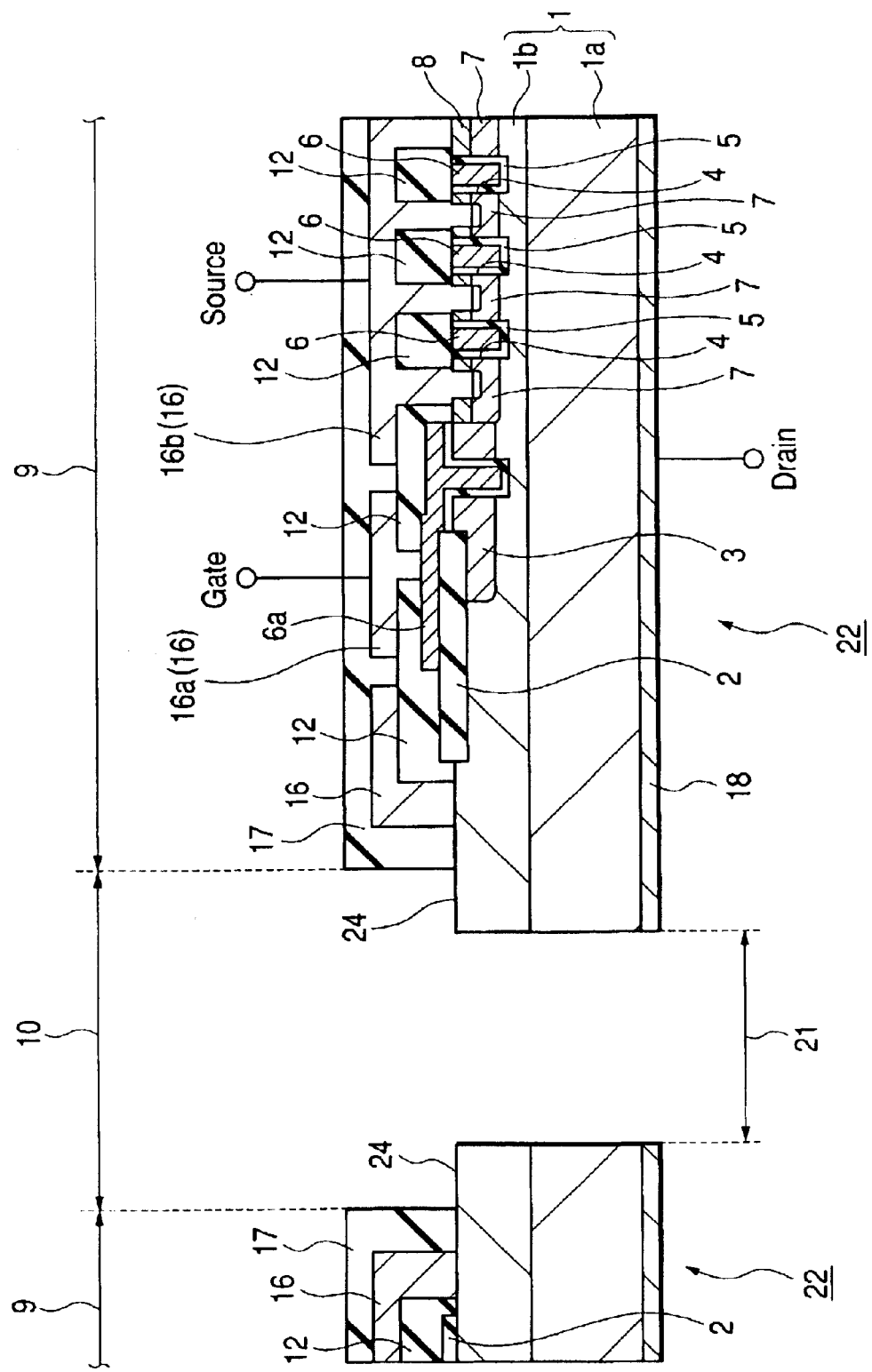
FIG. 29 is a cross-sectional view of an essential part in a manufacturing step of the semiconductor device which follows the manufacturing step shown in FIG. 27.
Figure 30:
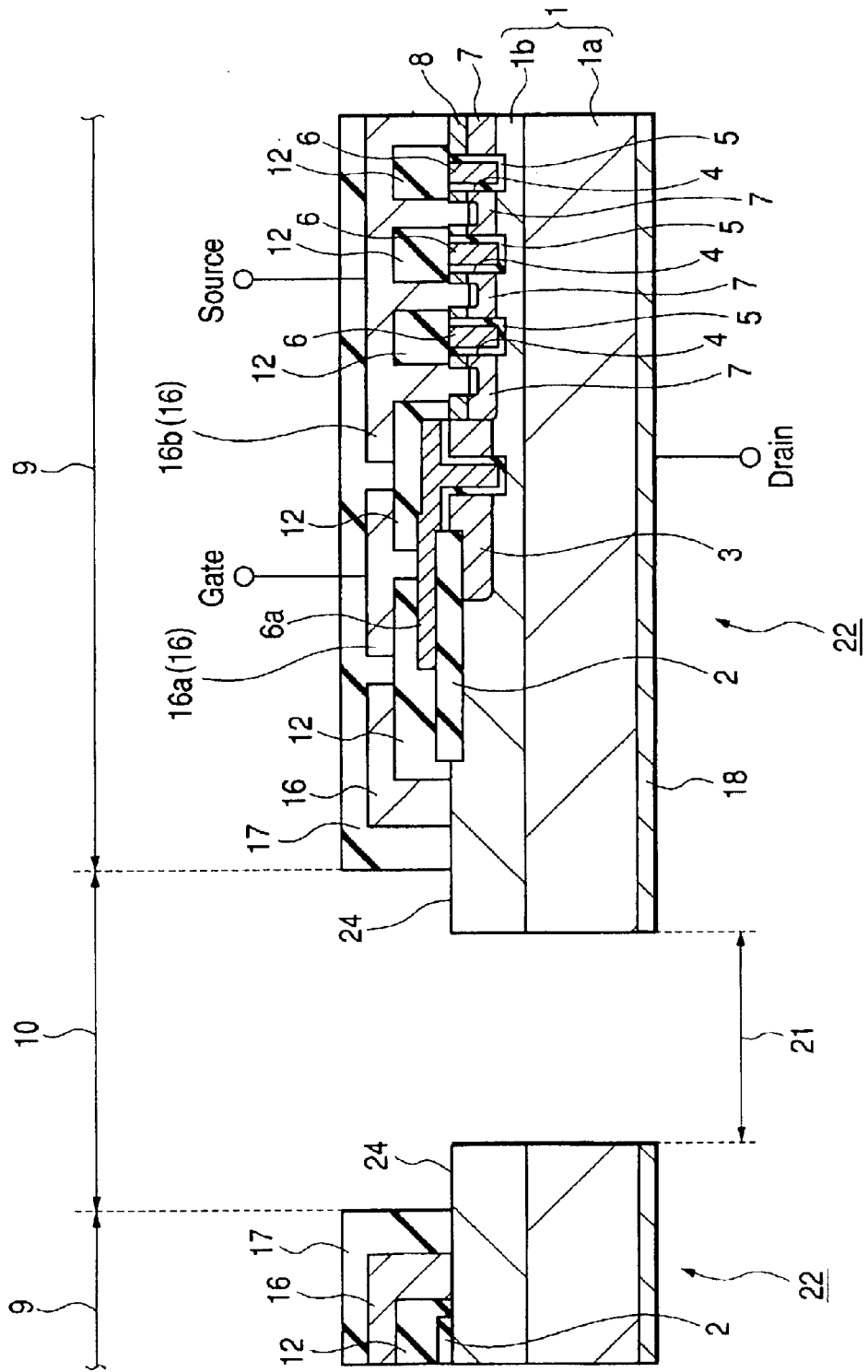
FIG. 30 is a cross-sectional view of an essential part in a manufacturing step of the semiconductor device which follows the manufacturing step shown in FIG. 28.

FIG. 26 is a partially enlarged plan view of a semiconductor device of still another embodiment of the present invention and corresponds to FIG. 7 in the above-mentioned embodiment 1. FIG. 27 is a cross-sectional view taken along a line A—A in FIG. 26. FIG. 28 is a cross-sectional view taken along a line B—B in FIG. 26. Further, FIG. 29 and FIG. 30 respectively correspond to a cross-sectional view taken along a line A—A and a cross-sectional view taken along a line B—B after the semiconductor device shown in FIG. 26 is diced. Accordingly, FIG. 26 to FIG. 30 respectively correspond to FIG. 7 to FIG. 11 of the above-mentioned embodiment 1.

Also in this embodiment, the groove 11 is formed in the scribe region 10 other than the alignment pattern forming regions 23 such that the alignment pattern forming regions 23 remain inside the scribe region 10. However, different from the above-mentioned embodiment 1, as shown in FIG. 26, the groove 11 is formed such that a width of the groove 11 is narrower than a width of the dicing line (region ground by the dicing saw or the like) 21 in the dicing step. Further, in the same manner as the above-mentioned embodiment 2, the alignment pattern forming regions 23 are formed like bridges with respect to the groove 11. That is, the alignment pattern forming regions 23 are formed such that the alignment pattern forming regions 23 are connected with or in continuity with the non-groove regions 24 of the scribe region 10 which remain at both sides of the groove 11 (regions which are not etched in the groove 11 forming step out of the scribe region 10). Since other structures and manufacturing steps of the semiconductor device in this embodiment are substantially equal to those of the above-mentioned embodiment 1, the explanation thereof is omitted here.

Embodiment 5

Figure 31:
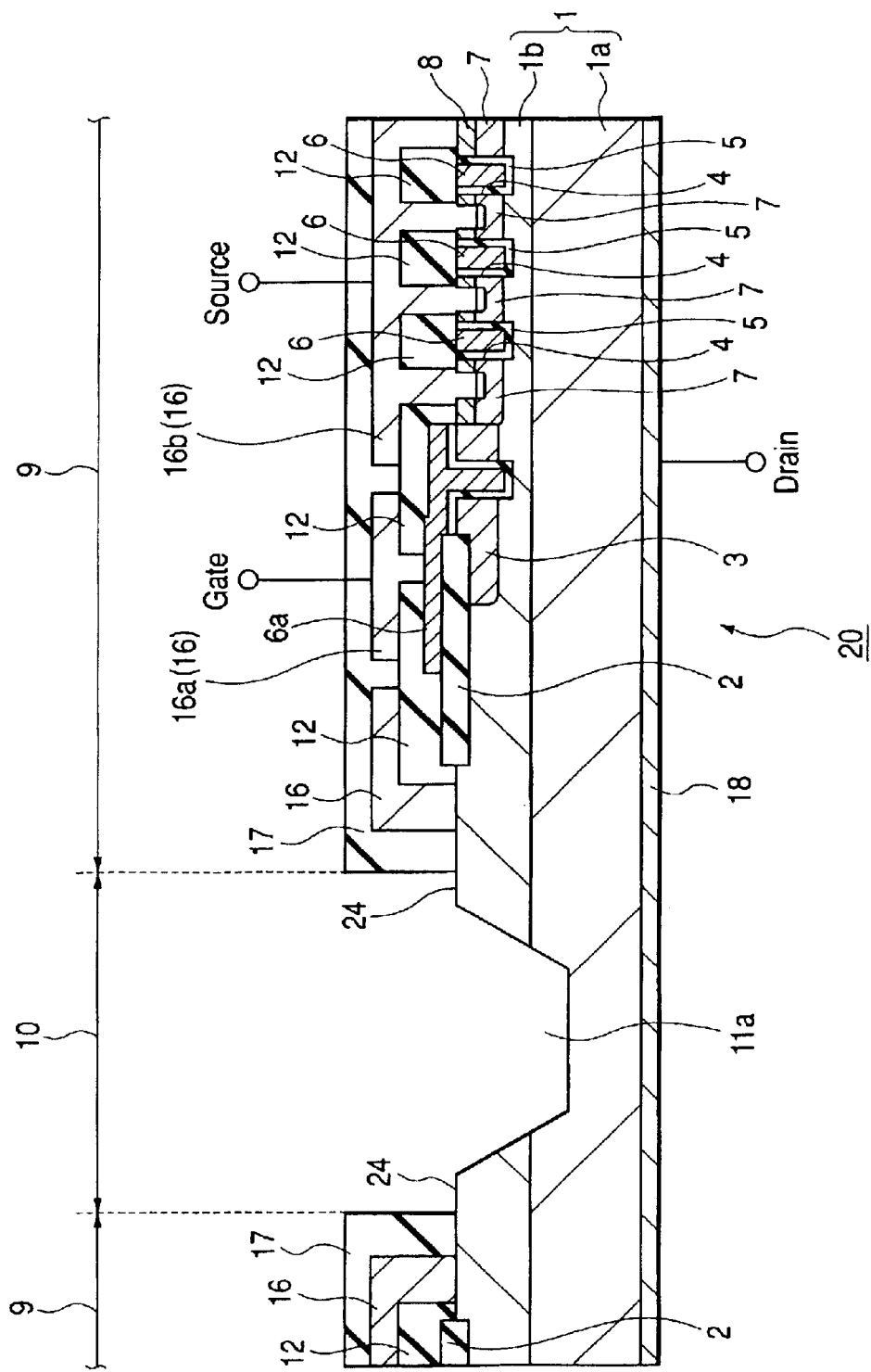
FIG. 31 is a cross-sectional view of an essential part of a semiconductor device according to another embodiment of the present invention.
Figure 32:
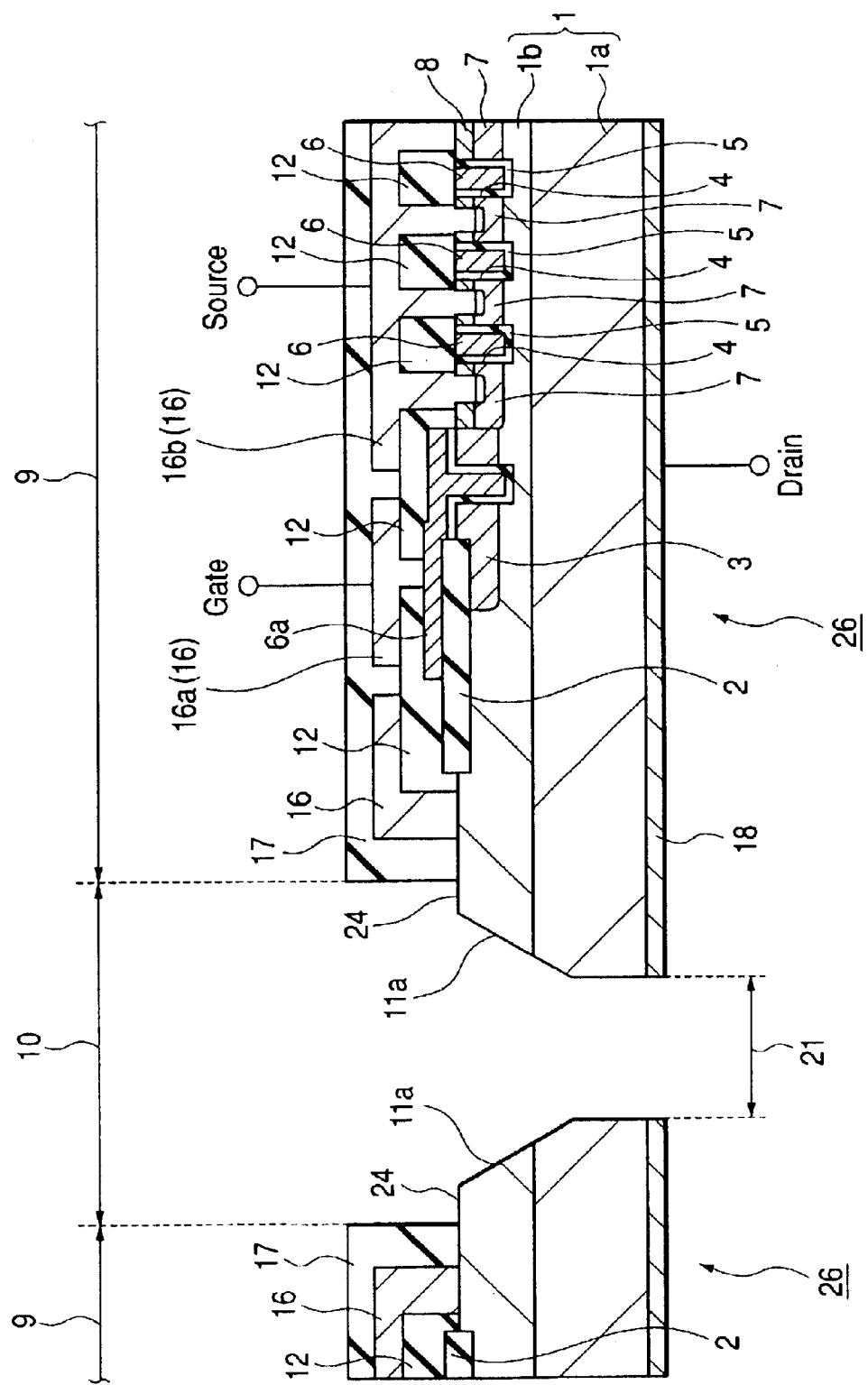
FIG. 32 is a cross-sectional view of an essential part in a manufacturing step of the semiconductor device which follows the manufacturing step shown in FIG. 31.

FIG. 31 is a cross-sectional view of an essential part of a semiconductor device of still another embodiment of the present invention and corresponds to FIG. 8 in the above-mentioned embodiment 1. Further, FIG. 32 is a cross-sectional view of an essential part after dicing the semiconductor device shown in FIG. 31 and corresponds to FIG. 10 of the above-mentioned embodiment 1.

Also in this embodiment, in the same manner as the above-mentioned embodiment 1, a groove 11a (corresponding to the groove 11 in the above-mentioned embodiment 1) is formed in the scribe region 10 other than the alignment pattern forming regions 23 such that the alignment pattern forming regions 23 remain inside the scribe region 10. However, as shown in FIG. 31, the groove 11a has a taper or a tapered shape. Accordingly, side walls of the groove 11a are not perpendicular to the main surface of the semiconductor wafer 1 and are inclined with respect to the main surface of the semiconductor wafer 1. The tapered grooves 11a may be formed by an isotropic etching method at the time of forming the groove 11a in the semiconductor wafer 1 by a photolithography method or an etching method. As the isotropic etching, it is possible to adopt an isotropic dry etching which uses a $CF_4$ gas or an $O_2$ gas, for example. Further, it is also possible to adopt a wet etching which uses a fluorine nitric acid.

FIG. 33 is an explanatory view conceptually showing an overall shape of a semiconductor chip 26 obtained by dicing the semiconductor wafer 1 when the tapered groove 11a is formed inside the scribe region 10 as shown in FIG. 31. FIG. 34 is an explanatory view for showing a manner in which the semiconductor chip 26 shown in FIG. 33 is picked up by a collet 27.

As shown in FIG. 33, upper-end corner portions of the semiconductor substrate region of the semiconductor chip 26 are configured to be chamfered due to the taper of the groove 11a. Accordingly, in the step for performing the pellet bonding step or the die bonding step after the dicing step, as shown in FIG. 34, an area of the semiconductor chip 26 which is brought into contact with the collet 27 for picking up the semiconductor chip 26 is increased. It is preferable to align an inclination angle of the surface of the collet 27 which is brought into contact with the semiconductor chip 26 with a taper angle of the groove 11a for the purpose of increasing the contact area between the collet 27 and the semiconductor chip 26. Due to such a constitution, it is possible to reduce stress applied to the semiconductor chip 26 at the time of picking up the semiconductor chip 26 using the collet 27 and hence, the semiconductor chip 26 can be prevented from the occurrence of chipping. Accordingly, the yield rate of the assembling steps of the semiconductor device can be enhanced so that a manufacturing cost of the semiconductor device can be reduced.

Embodiment 6

FIG. 35 is a cross-sectional view of an essential part in the manufacturing steps of the semiconductor device in still another embodiment of the present invention and corresponds to the step stages shown in FIG. 2 in the above-mentioned embodiment 1. Since the steps of this embodiment are equal to corresponding steps of the above-mentioned embodiment 1 up to the manufacturing steps shown in FIG. 1, the explanation of these steps is omitted in this embodiment 6.

In this embodiment, as shown in FIG. 35, at the time of forming trench-gate-forming grooves, that is, gate-use trenches 4, a groove 11b is simultaneously formed in a scribe region 10. That is, after performing the steps shown in FIG. 1, a photo resist pattern which exposes a region where the gate-use trenches 4 and the groove 11b are to be formed and covers regions other than such an exposed region is formed on the semiconductor wafer 1. Using this photo resist pattern as an etching mask, the semiconductor wafer 1 exposed therefrom is removed by etching. Accordingly, the gate-use trenches 4 and the groove 11b for stress attenuation are simultaneously formed. The groove 11b corresponds to the groove 11 in the above-mentioned embodiment 1 and has a function substantially equal to the function of the groove 11. Further, the grooves 11b are formed in an approximately grid array with respect to a main surface of the semiconductor wafer 1 in the same manner as the grooves 11.

In this embodiment, a width of the groove 11b is larger than a width of the gate-use trench 4. Here, the width of the groove 11b corresponds to a width in a plane perpendicular to the extending direction of the scribe region 10 or the groove 11b, while the width of the gate-use trench 4 corresponds to a width in a plane perpendicular to the extending direction of the gate-use trench 4. Further, the width of the groove 11b is larger than a stacked thickness (film thickness) of the gate electrode material film and is preferably two or more times as large as the stacked thickness of the gate electrode material film. The stacked thickness of the gate electrode material film corresponds to the thickness of a gate line portion 6a. Due to such a constitution, when gate portions 6 which are embedded in the gate-use trenches 4 are formed by etching back the gate electrode material film, it is possible to remove the gate electrode material film stacked on inner walls of the groove 11b.

In a step for forming the gate-use trenches 4 and the groove 11b, first of all, an anisotropic dry etching which uses a $SF_6$ gas and an $O_2$ gas, for example, is performed and, thereafter, an isotropic dry etching which uses a $CF_4$ gas and an $O_2$ gas, for example, is performed. Here, an etching rate depends on a surface area of a region to be etched. Since the width of the groove 11b is larger than the width of the trench 4 as mentioned above, a depth of the groove 11b becomes greater than a depth of the trench 4. Accordingly, it is possible to form the groove 11b having the depth which sufficiently contributes to the attenuation of stress without adding a special step. It is more preferable that the groove 11b has a depth which allows the groove 11b to penetrate an epitaxial layer 1b and to reach a semiconductor substrate 1a which constitutes a highly concentrated semiconductor substrate layer.

Since other structures and manufacturing steps of the semiconductor device in this embodiment are substantially equal to those of the above-mentioned embodiment 1, the explanation thereof is omitted here.

In this embodiment, in addition to the advantageous effect of the above-mentioned first embodiment 1, the groove 11b for attenuating stress can be simultaneously formed together with the gate-use trenches 4 and hence, the number of manufacturing steps can be reduced. Accordingly, a manufacturing cost of the semiconductor device can be reduced.

Embodiment 7

Figure 36:
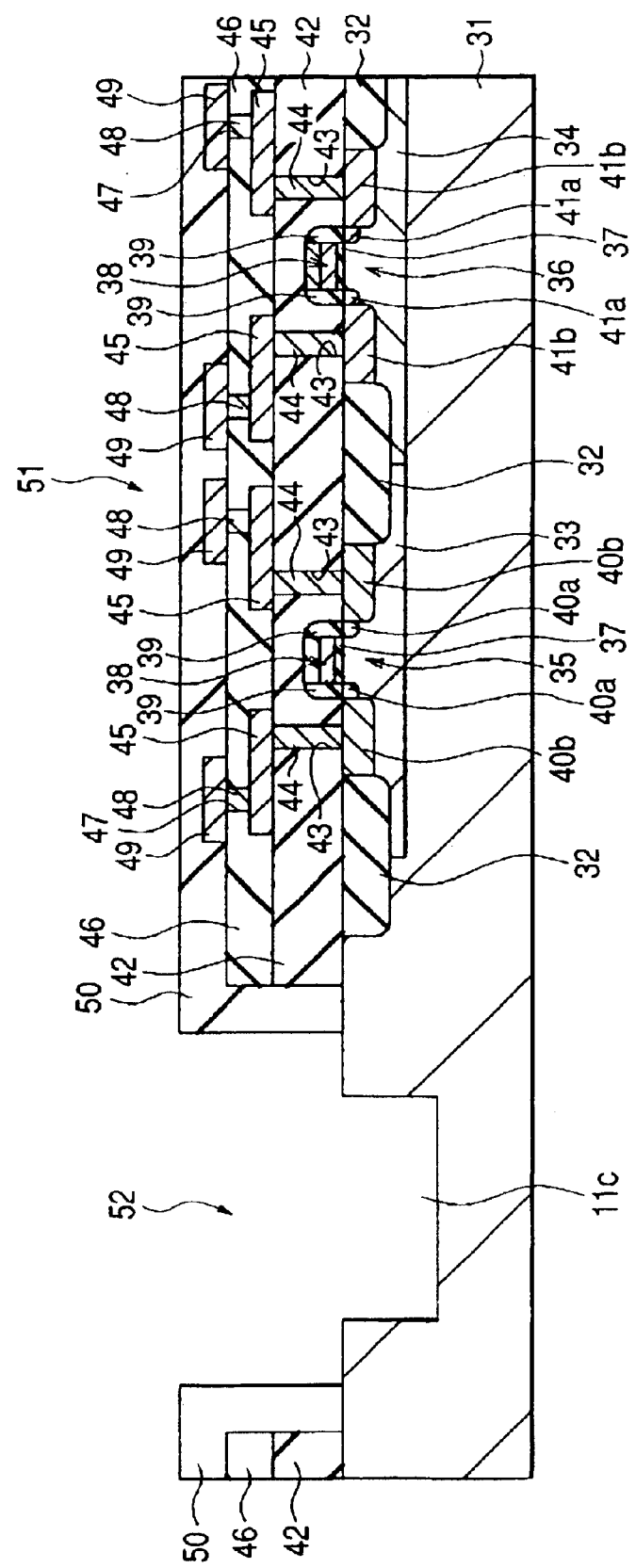
FIG. 36 is a cross-sectional view of an essential part in a manufacturing step of a semiconductor device according to another embodiment of the present invention.

In the above-mentioned embodiment 1, the vertical MISFETs are formed in a plurality of semiconductor element forming regions of the semiconductor wafer respectively. However, in this embodiment, the explanation is made with respect to a case in which lateral type MISFETs, here, CMISFETs (Complementary Metal Insulator Semiconductor Field Effect Transistors) are formed on a plurality of respective semiconductor element forming regions of the semiconductor wafer so as to manufacture the semiconductor device. Here, the lateral type MISFET corresponds to a MISFET in which an electric current between a source and a drain flows in the horizontal direction of the semiconductor wafer (direction substantially parallel to a main surface of the semiconductor wafer). FIG. 36 is a cross-sectional view of an essential part of the semiconductor device of this embodiment during a manufacturing step thereof.

As shown in FIG. 36, on a main surface of the semiconductor wafer 31 made-of p-type single crystal silicon, device separation regions 32 made of silicon oxide or the like are formed by a LOCOS method or a STI (Shallow Trench Isolation) method or the like. In the semiconductor wafer 31, p-type wells 33 and n-type wells 34 are formed. With respect to a region of the p-type well 33, in an active region surrounded by the device separation region 32, an n-channel type MISFET 35 is formed. Further, with respect to a region of the n-type well 34, in an active region surrounded by the device separation region 32, a p-channel type MISFET 36 is formed.

Gate insulation films 37 of the n-channel type MISFET 35 and the p-channel type MISFET 36 are formed of a thin silicon oxide film or the like, for example, and are formed by a thermal oxidization method, for example. Gate electrodes 38 of the n-channel type MISFET 35 and the p-channel type MISFET 36 are formed by laminating a titanium silicide ($TiSi_x$) layer or a cobalt silicide ($CoSi_x$) layer on a polycrystalline silicon film. On a side wall of the gate electrode 38, a side wall spacer or a side wall 39 which is made of oxide silicon, for example, is formed.

Source and drain regions of the n-channel type MISFET 35 are provided with an LDD (Lightly Doped Drain) structure which includes an $n^-$type semiconductor region 40a and an $n^+$-type semiconductor region 40b having impurity concentration higher than that of the $n^-$-type semiconductor region 40a. Source and drain regions of the p-channel type MISFET 36 are provided with an LDD (Lightly Doped Drain) structure which includes a p type semiconductor region 41a and a $p^+$-type semiconductor region 41b having impurity concentration higher than that of the $p^-$type semiconductor region 40a.

On the semiconductor wafer 31, an interlayer insulation film 42 made of a silicon oxide film or the like is formed. In contact holes 43 formed in the interlayer insulation film 42, plugs 44 made of tungsten or the like are embedded. On the interlayer insulation film 42, lines 45 made of aluminum alloy or the like are formed. The lines 45 are electrically connected with the $n^+$-type semiconductor region 40b, the $p^+$-type semiconductor region 41b or the gate electrodes 38 by way of plugs.

On the interlayer insulation film 42, an interlayer insulation film 46 is formed such that the interlayer insulation film 46 covers the lines 45. In through holes 47 formed in the interlayer insulation film 46, plugs 48 made of tungsten or the like are embedded. On the interlayer insulation film 46, lines 49 made of aluminum alloy or the like are formed and these lines 46 are electrically connected with the lines 45 by way of the plugs 48. Here, the number of line layers can be arbitrarily changed depending on designing.

On the main surface of the semiconductor wafer 31, to cover the semiconductor element forming regions, an insulation film (PIQ film) 50 for protecting a front surface which is made of polyimide-based resin or the like, for example, is formed. The insulation film 50 is patterned when necessary so as to form bonding pads or the like not shown in the drawing.

Also in this embodiment, in the same manner as the above-mentioned embodiment 1, in the scribe region 52 defined between respective semiconductor element forming regions 51 of the main surface of the semiconductor wafer 31, a groove 11c is formed. In the same manner as the above-mentioned groove 11, the groove 11c is formed in the scribe region 52 except for the alignment pattern forming regions such that the alignment pattern forming regions remain inside the scribe region 52. The structure and the forming steps of the groove 11c are substantially same as those of the groove 11 and hence, their explanation is omitted here. Although the forming step of the groove 11c may be performed at any arbitrary stage of the steps, it is preferable to perform the forming step before a metal material film (for example, a metal material film for forming plugs or a metal material film for forming lines) is formed. Due to such processing, stress which occurs because of the difference in thermal expansion coefficient between the semiconductor wafer 31 and the metal material film can be dispersed or attenuated in the surface of the semiconductor wafer by the groove 11c. When the gate electrodes 38 includes the metal material film or the like, it is preferable to form the groove 11c before the gate electrode 38 is formed. Accordingly, it is preferable to form the groove 11c before or in the midst of forming the semiconductor elements on the semiconductor wafer 31 and, at the same time, before forming the metal material film (gate electrode, lines or the like) of the semiconductor element.

Embodiment 8

Figure 37:
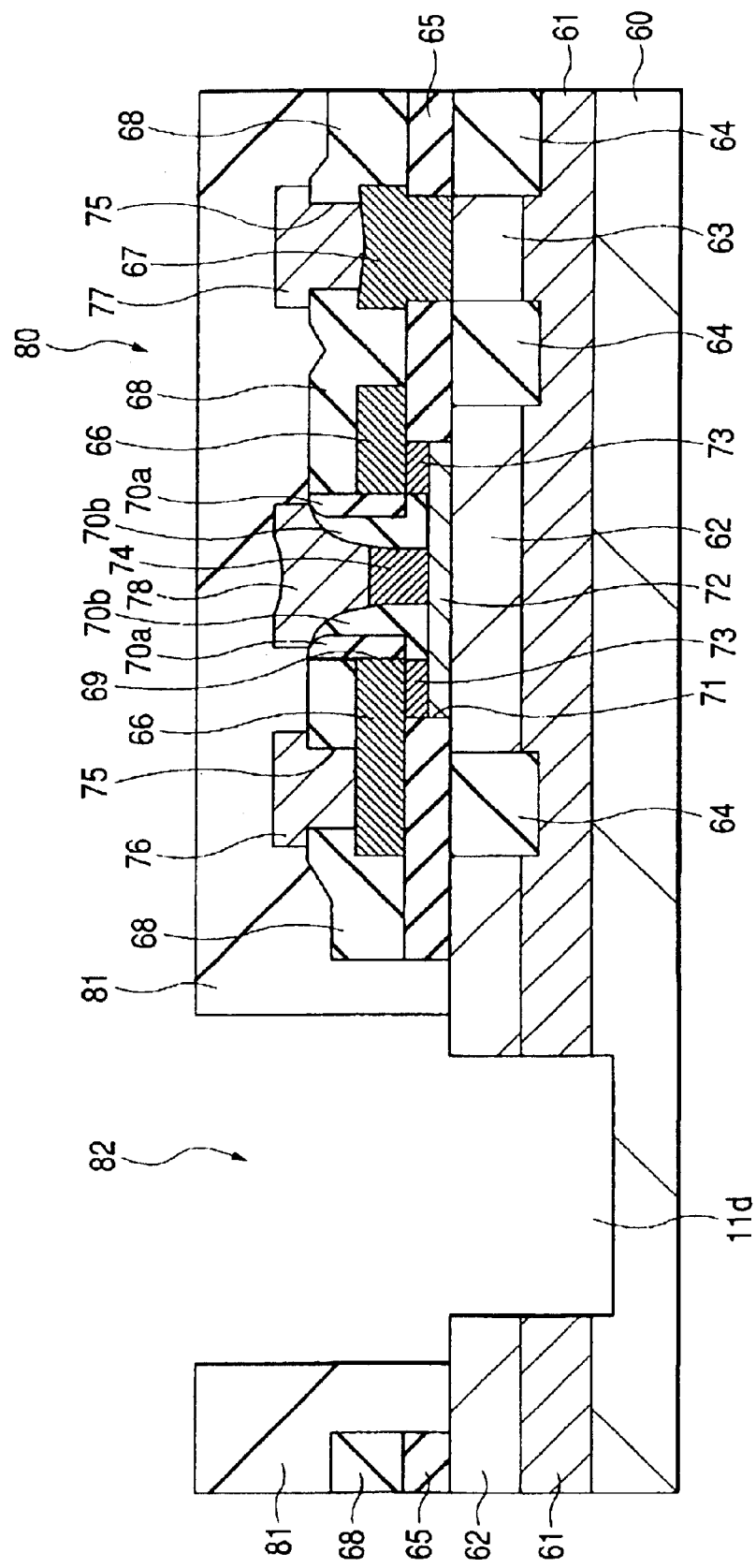
FIG. 37 is a cross-sectional view of an essential part in a manufacturing step of a semiconductor device according to another embodiment of the present invention.

Although the vertical MISFETs are formed on a plurality of respective semiconductor element forming regions of the semiconductor wafer in the above-mentioned embodiment 1, the embodiment 8 is explained with respect to a case in which a semiconductor device is manufactured by forming HBTs (Hetero-Junction Bipolar Transistors) on a plurality of respective semiconductor element forming regions of the semiconductor wafer. FIG. 37 is a cross-sectional view of a semiconductor device of this embodiment in manufacturing step thereof.

As shown in FIG. 37, on a p-type semiconductor wafer 60, n-type collector embedded regions 61 of the HBTs and $n^-$-type collector regions 62 and $n^+$-type collector pullout regions 63 of the HBTs are formed. On a main surface of the semiconductor wafer 60, separation portions 64 are formed. Further, on the main surface of the semiconductor wafer 60, a silicon nitride film 65, a polycrystalline silicon film 66 for forming an external base electrode, a polycrystalline silicon film 67 for collector pullout electrode, and a silicon oxide film 68 are formed.

On inner wall surfaces of an opening portion 69 formed in the polycrystalline silicon film 66 and the silicon oxide film 68, a first side wall insulation film 70a and a second side wall insulation film 70b are formed. On the $n^-$-type collector region 62 which is exposed from an opening portion 71 formed in the silicon nitride film 65, a SiGe layer 72 made of single crystal is formed. The single crystal SiGe layer 72 is connected to the polycrystalline silicon film 66 through a polycrystalline SiGe layer 73. On the single crystal SiGe layer 72 which is exposed from the second side wall insulation film 70b, a conductive film 74 which is made of single crystalline silicon or polycrystalline silicon 66 is formed. Via a through hole or a contact hole 75 formed in the silicon oxide film 68, a base electrode 76 which is connected to the polycrystalline silicon film 66 for forming external base electrode and a collector electrode 77 which is connected to the polycrystalline silicon film 66 for forming collector pullout electrode are formed, while an emitter electrode 78 which is connected to the conductive film 74 is further formed. On a main surface of the semiconductor wafer 60, an insulation film (PIQ film) 81 for surface protection which is made of polyimide-based resin or the like is formed such that the insulation film 81 covers the semiconductor element forming region 80. The insulation film 81 is patterned so as to form bonding pads not shown in the drawing. The HBTs having such a structure are formed on respective semiconductor element forming regions 80 of the semiconductor wafer 60.

Also in this embodiment, in the same manner as the above-mentioned embodiment 1, in the scribe region 82 defined between respective semiconductor element forming regions 80 of the main surface of the semiconductor wafer 60, a groove 11d is formed. In the same manner as the above-mentioned groove 11, the groove 11d is formed in the scribe region 82 such that except for the alignment pattern forming regions such that the alignment pattern forming regions remain inside the scribe region 82. The structure and the forming step of the groove 11d are substantially same as those of the groove 11 and hence, their explanation is omitted here. Although the forming step of the groove 11d may be performed at any arbitrary stage of the steps, it is preferable to perform the forming step before a metal material film (for example, a metal material film for forming the base electrode 76, the collector electrode 77 and the emitter electrode 78) is formed. Due to such processing, stress which occurs due to the difference in thermal expansion coefficient between the semiconductor wafer 60 and the metal material film can be dispersed or attenuated in the surface of the semiconductor wafer by the groove 11d. Accordingly, it is preferable to form the groove 11d before or in the midst of forming the semiconductor elements on the semiconductor wafer 60 and, at the same time, before forming the metal material film (the base electrode, the collector electrode, the emitter electrode or the like) of the semiconductor element.

Although the inventions made by the inventors have been specifically explained based on the embodiments, it is needless to say that the present invention is not limited to the above-mentioned embodiments and can be modified in various forms without departing from the gist of the present invention.

Although the explanation has been made with respect to the case in which the semiconductor device is manufactured by forming a plurality of the power MISFETs, lateral type MISFETs or the HBTs having the trench-type gate structure on the semiconductor wafer, the present invention is not limited to such a semiconductor device and is applicable to a semiconductor device which is manufactured by forming other various types of semiconductor elements on the semiconductor wafer.

Further, the structures and the manufacturing methods of the above-mentioned embodiments can be combined.

To briefly explain the advantageous effects obtained by typical inventions among the inventions which are disclosed by the present application, they are as follows.

In the scribe region between a plurality of semiconductor element forming regions of the semiconductor substrate, the groove is formed in the scribe region except for the alignment pattern forming regions such that the alignment pattern forming regions remain and hence, it is possible to perform fine processing. Further, the manufacturing yield rate of the semiconductor device can be enhanced.

Further, the groove is formed in the scribe region of the semiconductor substrate at the time of forming the gate-use trenches of the semiconductor element having the trench-type gate structure by etching and hence, the number of manufacturing steps can be reduced. Further, a manufacturing cost of the semiconductor device can be reduced.

What is claimed is:
1. A manufacturing method of a semiconductor device comprising the steps of:
    (a) preparing a semiconductor substrate;
    (b) forming a plurality of semiconductor elements on a plurality of semiconductor element forming regions of the semiconductor substrate; and
    (c) removing potions of the semiconductor substrate to form grooves in scribe regions defined between the plurality of semiconductor element forming regions of the semiconductor substrate such that alignment pattern forming regions remain in the scribe regions,
    wherein the grooves penetrate into the semiconductor substrate with bottom portions set therein, and
    the grooves are formed outside of the alignment pattern forming regions.
2. A manufacturing method of a semiconductor device according to claim 1, further including a step of cutting the semiconductor substrate in the scribe regions.
3. A manufacturing method of a semiconductor device according to claim 1, wherein an alignment pattern used in a photolithography step is formed on the alignment pattern forming regions.
4. A manufacturing method of a semiconductor device according to claim 1, wherein the alignment pattern forming regions are regions where an alignment pattern is already formed at the time of forming the grooves in the step (c).
5. A manufacturing method of a semiconductor device according to claim 1, wherein in the step (c), the alignment pattern forming regions remain inside the grooves like islands in the scribe regions.
6. A manufacturing method of a semiconductor device according to claim 1, wherein in the step (c), the grooves are formed in a main surface of the semiconductor substrate in a grid array.
7. A manufacturing method of a semiconductor device according to claim 1, wherein in the step (c), the grooves are formed by an etching method, and the alignment pattern forming regions are not etched during the etching.
8. A manufacturing method of a semiconductor device according to claim 1, wherein the grooves have a tapered shape.
9. A manufacturing method of a semiconductor device according to claim 8, further including a step of cutting the semiconductor substrate in the scribe regions,
    wherein taper-shaped portions of the grooves remain at corner portions of respective cut pieces.
10. A manufacturing method of a semiconductor device according to claim 1, wherein in the step (c), the grooves are formed such that TEG pattern forming regions also remain in the scribe regions.
11. A manufacturing method of a semiconductor device according to claim 1, wherein the step (c) is performed before the step (b) or in the midst of the step (b).
12. A manufacturing method of a semiconductor device according to claim 1, wherein the step (c) is performed before forming metal electrode layers of the plurality of semiconductor elements.
13. A manufacturing method of a semiconductor device according to claim 1, wherein the plurality of semiconductor elements include semiconductor elements having a trench-type gate structure.
14. A manufacturing method of a semiconductor device comprising the steps of:
    (a) preparing a semiconductor substrate;
    (b) forming a plurality of semiconductor elements on a plurality of semiconductor element forming regions of the semiconductor substrate; and

(c) forming grooves in scribe regions defined between the plurality of semiconductor element forming regions of the semiconductor substrate such that alignment pattern forming regions remain in the scribe regions, wherein the plurality of semiconductor elements include semiconductor elements having a trench-type gate structure, and the semiconductor substrate includes a semiconductor substrate layer and an epitaxial layer formed over the semiconductor substrate layer, and the grooves penetrate the epitaxial layer and reach the semiconductor substrate layer.

15. A manufacturing method of a semiconductor device according to claim 1, wherein the plurality of semiconductor elements include semiconductor elements having metal gate electrodes, and wherein the step (c) is performed before forming the metal gate electrodes.

16. A manufacturing method of a semiconductor device according to claim 1, wherein the plurality of semiconductor elements include field effect transistors.

* * * * *